United States Patent
Raring et al.

(10) Patent No.: US 10,522,976 B1
(45) Date of Patent: *Dec. 31, 2019

(54) LASER DEVICES USING A SEMIPOLAR PLANE

(71) Applicant: Soraa Laser Diode, Inc., Goleta, CA (US)

(72) Inventors: James W. Raring, Santa Barbara, CA (US); You-Da Lin, Goleta, CA (US); Christiane Elsass, Santa Barbara, CA (US)

(73) Assignee: Soraa Laser Diode, Inc., Goleta, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/118,217

(22) Filed: Aug. 30, 2018

Related U.S. Application Data

(63) Continuation of application No. 15/424,551, filed on Feb. 3, 2017, now Pat. No. 10,069,282, which is a
(Continued)

(51) Int. Cl.
  *H01S 5/00* (2006.01)
  *H01S 5/343* (2006.01)
  (Continued)

(52) U.S. Cl.
  CPC .......... *H01S 5/34333* (2013.01); *H01L 33/08* (2013.01); *H01S 5/028* (2013.01);
  (Continued)

(58) Field of Classification Search
  CPC .... H01S 5/2009; H01S 5/2201; H01S 5/3216; H01S 5/34333; H01S 5/3202; H01S 5/3405; H01S 5/2214; H01S 5/0287; H01S 5/028; H01S 5/22; H01S 5/0014; H01S 5/0425; H01S 5/3214; H01L 33/08;
  (Continued)

(56) References Cited

U.S. PATENT DOCUMENTS

| 4,318,058 A | 3/1982 | Mito et al. |
| 4,341,592 A | 7/1982 | Shortes et al. |

(Continued)

FOREIGN PATENT DOCUMENTS

| CN | 1538534 | 10/2004 |
| CN | 1702836 | 11/2005 |

(Continued)

OTHER PUBLICATIONS

U.S. Appl. No. 12/481,543, Non-Final Office Action dated Jun. 27, 2011, 10 pages.
(Continued)

*Primary Examiner* — Vu A Vu
(74) *Attorney, Agent, or Firm* — Kilpatrick Townsend & Stockton LLP

(57) ABSTRACT

An optical device includes a gallium and nitrogen containing substrate comprising a surface region configured in a (20-2-1) orientation, a (30-3-1) orientation, or a (30-31) orientation, within +/−10 degrees toward c-plane and/or a-plane from the orientation. Optical devices having quantum well regions overly the surface region are also disclosed.

13 Claims, 21 Drawing Sheets

Related U.S. Application Data continuation of application No. 14/883,137, filed on Oct. 14, 2015, now Pat. No. 9,590,392, which is a continuation of application No. 14/604,223, filed on Jan. 23, 2015, now Pat. No. 9,166,374, which is a continuation of application No. 13/651,291, filed on Oct. 12, 2012, now Pat. No. 8,971,370.

(60) Provisional application No. 61/546,792, filed on Oct. 13, 2011.

(51) Int. Cl.

| | | |
|---|---|---|
| *H01S 5/028* | (2006.01) | |
| *H01S 5/22* | (2006.01) | |
| *H01S 5/34* | (2006.01) | |
| *H01S 5/32* | (2006.01) | |
| *H01S 5/20* | (2006.01) | |
| *H01L 33/08* | (2010.01) | |
| *H01L 41/332* | (2013.01) | |
| *H01L 21/48* | (2006.01) | |
| *H01L 21/461* | (2006.01) | |
| *H01L 21/027* | (2006.01) | |
| *H01L 21/04* | (2006.01) | |
| *H01L 21/302* | (2006.01) | |
| *H01L 21/311* | (2006.01) | |
| *H01L 21/469* | (2006.01) | |
| *H01L 21/28* | (2006.01) | |
| *H01S 5/042* | (2006.01) | |
| *H01L 33/16* | (2010.01) | |

(52) U.S. Cl.
CPC .......... *H01S 5/0287* (2013.01); *H01S 5/2009* (2013.01); *H01S 5/2201* (2013.01); *H01S 5/2214* (2013.01); *H01S 5/3202* (2013.01); *H01S 5/3216* (2013.01); *H01S 5/3401* (2013.01); *H01L 21/0274* (2013.01); *H01L 21/042* (2013.01); *H01L 21/28123* (2013.01); *H01L 21/302* (2013.01); *H01L 21/311* (2013.01); *H01L 21/461* (2013.01); *H01L 21/469* (2013.01); *H01L 21/4828* (2013.01); *H01L 33/16* (2013.01); *H01L 41/332* (2013.01); *H01S 5/0014* (2013.01); *H01S 5/0425* (2013.01); *H01S 5/22* (2013.01); *H01S 5/3214* (2013.01)

(58) Field of Classification Search
CPC . H01L 33/16; H01L 21/28123; H01L 21/469; H01L 21/311; H01L 21/302; H01L 21/042; H01L 21/0274; H01L 21/461; H01L 21/4828; H01L 41/332
USPC ...................................................... 372/45.01
See application file for complete search history.

(56) References Cited

U.S. PATENT DOCUMENTS

| | | |
|---|---|---|
| 4,860,687 A | 8/1989 | Frijlink |
| 4,911,102 A | 3/1990 | Manabe et al. |
| 5,331,654 A | 7/1994 | Jewell et al. |
| 5,334,277 A | 8/1994 | Nakamura |
| 5,527,417 A | 6/1996 | Iida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,821,555 A | 10/1998 | Saito et al. |
| 5,888,907 A | 3/1999 | Tomoyasu et al. |
| 5,951,923 A | 9/1999 | Horie et al. |
| 6,069,394 A | 5/2000 | Hashimoto et al. |
| 6,072,197 A | 6/2000 | Horino et al. |
| 6,153,010 A | 11/2000 | Kiyoku et al. |
| 6,195,381 B1 | 2/2001 | Botez et al. |
| 6,379,985 B1 | 4/2002 | Cervantes et al. |
| 6,451,157 B1 | 9/2002 | Hubacek |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 | 4/2006 | Chai et al. |
| 7,053,413 B2 | 5/2006 | D'Evelyn et al. |
| 7,128,849 B2 | 10/2006 | Setlur et al. |
| 7,132,691 B1 * | 11/2006 | Tanabe .................. B82Y 20/00 257/79 |
| 7,303,630 B2 | 12/2007 | Motoki et al. |
| 7,312,156 B2 | 12/2007 | Granneman et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,711,017 B2 | 5/2010 | Penn |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,956,360 B2 | 6/2011 | Haskell et al. |
| 7,968,864 B2 | 6/2011 | Akita et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,351,478 B2 | 1/2013 | Raring et al. |
| 8,355,418 B2 | 1/2013 | Raring et al. |
| 8,416,825 B1 | 4/2013 | Raring |
| 8,422,525 B1 | 4/2013 | Raring et al. |
| 8,971,370 B1 | 3/2015 | Raring et al. |
| 9,166,374 B1 | 10/2015 | Raring et al. |
| 9,590,392 B1 | 3/2017 | Raring et al. |
| 10,069,282 B1 * | 9/2018 | Raring .................. H01S 5/2201 |
| 2001/0048114 A1 | 12/2001 | Morita et al. |
| 2002/0027933 A1 | 3/2002 | Tanabe et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0200931 A1 | 10/2003 | Goodwin |
| 2003/0216011 A1 | 11/2003 | Nakamura et al. |

(56) References Cited

U.S. PATENT DOCUMENTS

| | | |
|---|---|---|
| 2003/0231370 A1* | 12/2003 | Fujii ............... H01L 51/5036 359/237 |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0151222 A1 | 8/2004 | Sekine |
| 2004/0233950 A1 | 11/2004 | Furukawa et al. |
| 2004/0247275 A1 | 12/2004 | Vakhshoori et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0033009 A1 | 2/2006 | Kobayashi et al. |
| 2006/0060131 A1 | 3/2006 | Atanackovic |
| 2006/0077795 A1 | 4/2006 | Kitahara et al. |
| 2006/0078022 A1 | 4/2006 | Kozaki et al. |
| 2006/0086319 A1 | 4/2006 | Kasai et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0193359 A1 | 8/2006 | Kuramoto |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | Leboeuf et al. |
| 2007/0093073 A1 | 4/2007 | Farrell, Jr. et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0092812 A1 | 4/2008 | Mcdiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0174738 A1 | 7/2008 | Takeda et al. |
| 2008/0191223 A1 | 8/2008 | Nakamura et al. |
| 2008/0198881 A1 | 8/2008 | Farrell et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0061857 A1 | 3/2009 | Kazmi |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0321778 A1 | 12/2009 | Chen et al. |
| 2010/0001300 A1 | 1/2010 | Raring et al. |
| 2010/0006546 A1 | 1/2010 | Young et al. |
| 2010/0006873 A1 | 1/2010 | Raring et al. |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0195687 A1 | 8/2010 | Okamoto et al. |
| 2010/0220262 A1 | 9/2010 | DeMille et al. |
| 2010/0246624 A1 | 9/2010 | Hiroyama et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0322276 A1 | 12/2010 | Yoshizumi et al. |
| 2010/0327291 A1 | 12/2010 | Preble et al. |
| 2011/0007766 A1 | 1/2011 | Farrell et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0064103 A1 | 3/2011 | Ohta et al. |
| 2011/0075694 A1 | 3/2011 | Yoshizumi et al. |
| 2011/0103418 A1 | 5/2011 | Hardy et al. |
| 2011/0128984 A1* | 6/2011 | Bhat ............... B82Y 20/00 372/45.012 |
| 2011/0129669 A1 | 6/2011 | Fujito et al. |
| 2011/0164637 A1 | 7/2011 | Yoshizumi et al. |
| 2011/0180781 A1 | 7/2011 | Raring et al. |
| 2011/0186887 A1 | 8/2011 | Trottier et al. |
| 2011/0216795 A1 | 9/2011 | Hsu et al. |
| 2011/0243172 A1 | 10/2011 | Lin et al. |
| 2011/0247556 A1 | 10/2011 | Raring et al. |
| 2011/0266551 A1 | 11/2011 | Thompson et al. |
| 2011/0279054 A1 | 11/2011 | Katona et al. |
| 2011/0286484 A1 | 11/2011 | Raring et al. |
| 2011/0292957 A1 | 12/2011 | Bhat et al. |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |
| 2013/0234111 A1 | 9/2013 | Pfister et al. |

FOREIGN PATENT DOCUMENTS

| | | |
|---|---|---|
| CN | 1781195 | 5/2006 |
| CN | 101009347 | 8/2007 |
| CN | 101079463 | 11/2007 |
| CN | 101099245 | 1/2008 |
| CN | 101171692 | 4/2008 |
| JP | 03287770 | 12/1991 |
| JP | 2007173467 | 7/2007 |
| WO | 2004084275 | 9/2004 |
| WO | 2008041521 | 4/2008 |

OTHER PUBLICATIONS

U.S. Appl. No. 12/482,440, Final Office Action dated Aug. 12, 2011, 7 pages.

U.S. Appl. No. 12/482,440, Non-Final Office Action dated Feb. 23, 2011, 6 pages.

U.S. Appl. No. 12/484,924, Final Office Action dated Oct. 31, 2011, 11 pages.

(56) References Cited

OTHER PUBLICATIONS

U.S. Appl. No. 12/484,924, Non-Final Office Action dated Apr. 14, 2011, 12 pages.
U.S. Appl. No. 12/491,169, Final Office Action dated May 11, 2011, 10 pages.
U.S. Appl. No. 12/491,169, Non-Final Office Action dated Oct. 22, 2010, 10 pages.
U.S. Appl. No. 12/497,289, Non-Final Office Action dated Feb. 2, 2012, 7 pages.
U.S. Appl. No. 12/497,289, Notice of Allowance dated May 22, 2012, 7 pages.
U.S. Appl. No. 12/502,058, Final Office Action dated Aug. 19, 2011, 13 pages.
U.S. Appl. No. 12/502,058, Non-Final Office Action dated Dec. 8, 2010, 15 pages.
U.S. Appl. No. 12/502,058, Notice of Allowance dated Apr. 16, 2012, 10 pages.
U.S. Appl. No. 12/502,058, Notice of Allowance dated Jul. 19, 2012, 8 pages.
U.S. Appl. No. 12/534,829, Non-Final Office Action dated Apr. 19, 2011, 9 pages.
U.S. Appl. No. 12/534,829, Notice of Allowance dated Dec. 21, 2011, 4 pages.
U.S. Appl. No. 12/534,829, Notice of Allowance dated Dec. 5, 2011, 7 pages.
U.S. Appl. No. 12/534,829, Notice of Allowance dated Oct. 28, 2011, 8 pages.
U.S. Appl. No. 12/534,838, Final Office Action dated Jan. 13, 2012, 12 pages.
U.S. Appl. No. 12/534,838, Non-Final Office Action dated May 3, 2011, 12 pages.
U.S. Appl. No. 12/534,838, Non-Final Office Action dated Mar. 20, 2012, 13 pages.
U.S. Appl. No. 12/534,838, Notice of Allowance dated Jun. 8, 2012, 8 pages.
U.S. Appl. No. 12/573,820, Final Office Action dated Oct. 11, 2011, 23 pages.
U.S. Appl. No. 12/573,820, Non-Final Office Action dated Mar. 2, 2011, 19 pages.
U.S. Appl. No. 12/749,466, Final Office Action dated Feb. 3, 2012, 16 pages.
U.S. Appl. No. 12/749,466, Non-Final Office Action dated Jul. 3, 2012, 18 pages.
U.S. Appl. No. 12/749,466, Non-Final Office Action dated Jun. 29, 2011, 20 pages.
U.S. Appl. No. 12/749,466, Notice of Allowance dated Jan. 2, 2013, 8 pages.
U.S. Appl. No. 12/759,273, Final Office Action dated Jun. 26, 2012, 10 pages.
U.S. Appl. No. 12/759,273, Non-Final Office Action dated Nov. 21, 2011, 10 pages.
U.S. Appl. No. 12/762,269, Non-Final Office Action dated Oct. 12, 2011, 12 pages.
U.S. Appl. No. 12/762,269, Notice of Allowance dated Apr. 23, 2012, 8 pages.
U.S. Appl. No. 12/762,271, Final Office Action dated Jun. 6, 2012, 13 pages.
U.S. Appl. No. 12/762,271, Non-Final Office Action dated Dec. 23, 2011, 12 pages.
U.S. Appl. No. 12/762,271, Notice of Allowance dated Aug. 8, 2012, 9 pages.
U.S. Appl. No. 12/762,278, Notice of Allowance dated Nov. 7, 2011, 11 pages.
U.S. Appl. No. 12/778,718, Non-Final Office Action dated Nov. 25, 2011, 12 pages.
U.S. Appl. No. 12/778,718, Notice of Allowance dated Apr. 3, 2012, 14 pages.
U.S. Appl. No. 12/778,718, Notice of Allowance dated Jun. 13, 2012, 7 pages.
U.S. Appl. No. 12/789,303, Non-Final Office Action dated Sep. 24, 2012, 20 pages.
U.S. Appl. No. 12/859,153, Non-Final Office Action dated Sep. 25, 2012, 22 pages.
U.S. Appl. No. 12/868,441, Final Office Action dated Dec. 18, 2012, 34 pages.
U.S. Appl. No. 12/868,441, Non-Final Office Action dated Apr. 30, 2012, 12 pages.
U.S. Appl. No. 12/868,441, Notice of Allowance dated Sep. 18, 2013, 13 pages.
U.S. Appl. No. 12/880,803, Non-Final Office Action dated Feb. 22, 2012, 9 pages.
U.S. Appl. No. 12/880,803, Notice of Allowance dated Jul. 18, 2012, 5 pages.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/883,652, Non-Final Office Action dated Apr. 17, 2012, 8 pages.
U.S. Appl. No. 12/884,993, Final Office Action dated Aug. 2, 2012, 15 pages.
U.S. Appl. No. 12/884,993, Non-Final Office Action dated on Mar. 16, 2012, 15 pages.
U.S. Appl. No. 12/884,993, Notice of Allowance dated Nov. 26, 2012, 11 pages.
U.S. Appl. No. 12/942,817, Non-Final Office Action dated Feb. 20, 2013, 12 pages.
U.S. Appl. No. 12/995,946, Non-Final Office Action dated Mar. 28, 2012, 18 pages.
U.S. Appl. No. 12/995,946, Non-Final Office Action dated Jan. 29, 2013, 25 pages.
U.S. Appl. No. 13/014,622, Final Office Action dated Apr. 30, 2012, 14 pages.
U.S. Appl. No. 13/014,622, Non-Final Office Action dated Nov. 28, 2011, 14 pages.
U.S. Appl. No. 13/046,565, Final Office Action dated Feb. 2, 2012, 17 pages.
U.S. Appl. No. 13/046,565, Final Office Action dated Jul. 19, 2012, 24 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 13/108,645, Notice of Allowance dated Jan. 28, 2013, 9 pages.
U.S. Appl. No. 13/114,806, Final Office Action dated Aug. 26, 2013, 22 pages.
U.S. Appl. No. 13/114,806, Non-Final Office Action dated Apr. 12, 2013, 22 pages.
U.S. Appl. No. 13/291,922, Final Office Action dated Jun. 18, 2013, 9 pages.
U.S. Appl. No. 13/291,922, Non-Final Office Action dated Feb. 20, 2013, 10 pages.
U.S. Appl. No. 13/354,639, Non-Final Office Action dated Nov. 7, 2012, 12 pages.
U.S. Appl. No. 13/354,639, Notice of Allowance dated Dec. 14, 2012, 8 pages.
U.S. Appl. No. 13/425,354, Non-Final Office Action dated Feb. 14, 2013, 13 pages.
U.S. Appl. No. 13/548,312, Final Office Action dated Mar. 13, 2014, 5 pages.
U.S. Appl. No. 13/606,894, Non-Final Office Action dated Feb. 5, 2013, 8 pages.
U.S. Appl. No. 13/651,291, Final Office Action dated Apr. 25, 2014, 26 pages.
U.S. Appl. No. 13/651,291, Non Final Office Action dated Sep. 25, 2014, 8 pages.
U.S. Appl. No. 13/651,291, Non-Final Office Action dated Dec. 23, 2013, 30 pages.

(56) References Cited

OTHER PUBLICATIONS

U.S. Appl. No. 13/651,291, Notice of Allowance dated Oct. 27, 2014, 8 pages.
U.S. Appl. No. 14/604,223, Non-Final Office Action dated Mar. 19, 2015, 18 pages.
U.S. Appl. No. 14/604,223, Notice of Allowance dated Jun. 22, 2015, 9 pages.
U.S. Appl. No. 15/424,551, Non-Final Office Action dated Jul. 31, 2017, 17 pages.
U.S. Appl. No. 15/424,551, Notice of Allowance dated May 4, 2018, 14 pages.
Abare et al., Cleaved and Etched Facet Nitride Laser Diodes, IEEE Journal of Selected Topics in Quantum Electronics, vol. 4, Issue 3, May-Jun. 1998, pp. 505-509.
Adesida et al., Characteristics of Chemically Assisted Ion Beam Etching of Gallium Nitride, Applied Physics Letters, vol. 65, Issue 7, Aug. 15, 1994, pp. 889-891.
Feezell et al., Development of Nonpolar and Semipolar InGaN/GaN Visible Light-Emitting Diodes, MRS Bulletin, vol. 34, Issue 5, May 2009, pp. 318-323.
Founta et al., Anisotropic Morphology of Nonpolar a-Plane GaN Quantum Dots and Quantum Wells, Journal of Applied Physics, vol. 102, Issue 7, 074304, Oct. 2, 2007, pp. 1-6.
Franssila, Tools for CVD and Epitaxy Introduction to Microfabrication, 2004, pp. 329-336.
Khan et al.,Cleaved Cavity Optically Pumped InGaN—GaN Laser Grown on Spinel Substrates, Applied Physics Letters, vol. 69, Issue 16, Oct. 14, 1996, pp. 2418-2420.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, Oct. 2004, pp. 7032-7035.
Okamoto et al., Continuous-Wave Operation of m-Plane InGaN Multiple Quantum Well Laser Diodes, The Japan Society of Applied Physics, JJAP Express Letter, vol. 46, No. 9, Feb. 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express, vol. 1, No. 7, 072201, Jun. 20, 2008, pp. 1-3.
Park, Crystal Orientation Effects on Electronic Properties of Wurtzite InGaN/GaN Quantum Wells, Journal of Applied Physics, vol. 91, Issue 12, Jun. 15, 2002, pp. 9904-9908.
International Application No. PCT/US2010/030939, International Search Report and Written Opinion dated Jun. 16, 2010, 9 pages.
International Application No. PCT/US2011/037792, International Search Report and Written Opinion dated Sep. 8, 2011, 9 pages.
Romanov et al., Strain-Induced Polarization in Wurtzite III-Nitride Semipolar Layers, Journal of Applied Physics, vol. 100, Issue 2, 023522, May 2006, pp. 1-10.
Schoedl et al., Facet Degradation of GaN Heterostructure Laser Diodes, Journal of Applied Physics, vol. 97, Issue 12, 123102, 2005, pp. 1-8.
Schremer et al., Progress in Etched Facet Technology for GaN and Blue Lasers, Proc. of SPIE, vol. 6473, 64731F, 2007, pp. 1-8.
Tyagi et al., Semipolar (1011) InGaN/GaN Laser Diodes on Bulk GaN Substrates, Japanese Journal of Applied Physics, vol. 46, No. 19, May 11, 2007, pp. L444-L445.
Zhong et al., Demonstration of High Power Blue-Green Light Emitting Diode on Semipolar (1122) Bulk GaN Substrate, Electronics Letters, vol. 43, Issue 15, Jul. 19, 2007, 2 pages.

* cited by examiner

LASER DEVICES USING A SEMIPOLAR PLANE

This application is a continuation of U.S. application Ser. No. 15/424,551, filed Feb. 3, 2017; which is a continuation of U.S. application Ser. No. 14/883,137, filed Oct. 14, 2015; which is a continuation of U.S. application Ser. No. 14/604,223, filed Jan. 23, 2015, now U.S. Pat. No. 9,166,374, issued Oct. 20, 2015; which is a continuation of U.S. application Ser. No. 13/651,291, filed Oct. 12, 2012, now U.S. Pat. No. 8,971,370, issued Mar. 3, 2015; which claims the benefit of U.S. Provisional Application No. 61/546,792, filed Oct. 13, 2011; each of which are incorporated by reference herein in their entirety.

BACKGROUND

The present invention is directed to optical devices and related methods. In particular, the invention provides a method and device for emitting electromagnetic radiation using nonpolar or semipolar gallium containing substrates such as GaN, AlN, InN, InGaN, AlGaN, and AlInGaN, and others. More particularly, the present invention provides a method and device using a gallium and nitrogen containing substrate configured on the {20-21} family of planes or an off-cut of the {20-21} family of planes toward the plus or minus c-plane and/or toward the a-plane according to one or more embodiments, but there can be other configurations. Such family of planes include, but are not limited to, (30-3-2), (20-2-1), (30-3-1), (30-32), (20-21), (30-31) or any orientation within +/−10 degrees toward c-plane and/or a-plane from these orientations. The invention can be applied to optical devices, lasers, light emitting diodes, solar cells, photoelectrochemical water splitting and hydrogen generation, photodetectors, integrated circuits, and transistors.

In the late 1800's, Thomas Edison invented the light bulb. The conventional light bulb, commonly called the "Edison bulb," has been used for over one hundred years for a variety of applications including lighting and displays. It uses a tungsten filament enclosed in a glass bulb sealed in a base, which is screwed into a socket coupled to a power source. Unfortunately the Edison light bulb dissipates most of the power consumed as thermal energy. It routinely fails due to thermal expansion and contraction of the filament element. Furthermore light bulbs emit light over a broad spectrum, much of which does not result in bright illumination or due to the spectral sensitivity of the human eye.

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application.

BRIEF SUMMARY

According to the present invention, techniques related generally to optical devices are provided. More particularly, the present invention provides a method and device using a gallium and nitrogen containing substrate configured on the {20-21} family of planes or an off-cut of the {20-21} family of planes toward the plus or minus c-plane and/or toward the a-plane according to one or more embodiments, but there can be other configurations. Such family of planes include, but are not limited to, (30-3-2), (20-2-1), (30-3-1), (30-32), (20-21), and (30-31) or any orientation within +/−10 degrees toward c-plane and/or a-plane from these orientations. In particular, the present invention provides a method and device for emitting electromagnetic radiation using nonpolar or semipolar gallium containing substrates such as GaN, AlN, InN, InGaN, AlGaN, and AlInGaN, and others.

In a specific embodiment, the present invention provides a gallium and nitrogen containing optical device with a substrate comprising configured in either a (30-3-2), (20-2-

1), (30-3-1), (30-32), (20-21), (30-31) or any orientation within +/−10 degrees toward c-plane and/or a-plane from these orientations. The device includes a separate confinement heterostructure (SCH) region overlying the surface region and a first barrier region overlying the separate confinement heterostructure. The device includes a plurality of quantum well regions overlying the surface region and a second barrier region overlying the plurality of quantum well regions. The device includes an electron blocking region overlying the second barrier region. If desired, quantum well regions can be provided over the surface region.

Preferably, the present invention provides for a method and resulting structure using growth of blue and green lasers and LEDs on {20-2-1} planes and off-cuts of these planes. In a preferred embodiment, the (20-2-1) planes desirably provide for high indium incorporation on overlying growth regions, and cause the emission of highly polarized light. Still preferably, the (20-2-1) planes provide resulting devices characterized by bright emissions and narrow FWHM in electroluminescence. In other embodiments, the method and resulting structure can also be applied to a (30-3-2) orientation, (20-2-1) orientation, (30-3-1) orientation, (30-32) orientation, (20-21) orientation, (30-31) orientation, or any orientation within +/−10 degrees toward c-plane and/or a-plane from these orientations for blue lasers and LEDs.

As an example, we had certain (20-21), (20-2-1), (30-3-1), and nonpolar m-plane substrates. With efforts for achieving high power blue laser requiring longer wavelength, we used these orientations. The results using (20-2-1), (20-21), and (30-3-1) substrates were impressive. For example, in the blue region we achieved bright and narrow electroluminescence as compared to m-plane. At about 450 nm, the FWHM is less than 20 nm on (20-2-1), between 20 nm and 25 nm for (20-21) and (30-3-1), whereas m-plane that has a FWHM of 27 nm to 33 nm. We also observed very polarized emissions from (20-2-1) and (30-3-1).

In the blue and green wavelength region, we observed a strong red-shift from the PL wavelength to the EL wavelength and a red-shift in EL wavelength as the current is increased on (20-2-1), which is an improvement over m-plane in the blue region and an improvement of (20-21) in the green region since these ladder planes show a strong blue-shift in the respective wavelength regimes. This red-shift likely implies that the claimed material quality is improved over m-plane in blue or (20-21) in the green where the strong blue-shift in-part implies in-homogenous broadening or other imperfections in the material quality. We believe the composition of (20-2-1) is homogenous.

We expect that this material on (20-2-1) with narrow FWHM and red-shifting wavelength translates into higher gain laser diodes, which will allow us to further improve the wall plug efficiency in both the blue and green wavelength regimes. In the blue regime, this could be important for high power laser diode where we would apply a very low reflectivity (1-7%) coating to the front facet for high slope efficiency, but still maintain low threshold current with the high material gain.

In an alternative specific embodiment, the present invention provides an alternative optical device and method. In a specific embodiment, the present invention provides an InGaN/GaN superlattice, which is used beneath the MQW active region. In a preferred embodiment, the optical device and method provides for an improved green emission. By applying an InGaN/GaN superlattice beneath the green MQW on (20-2-1), the present method and device provides:

1. Nearly equivalent electroluminescence brightness as (20-21);
2. The brightness of the material in EL scaled almost linearly with current, which implies low current droop;
3. The FWHM of the EL spectrum seems to be narrower than on (20-21);
4. The EL red-shifts from the PL and the EL red-shifts with increased current. Again, since blue-shift occurred on (20-21) we believe that the material quality, and hence the gain, will be much better on (20-2-1); and
5. We believe that by using (20-2-1) in green laser diode we will be able to increase the gain and hence increase the wall plug efficiency to greater than about 5%, greater than about 7%, or greater than about 10%.

In other embodiments, the present device uses an InGaN/GaN superlattice structure below the active region to improve the material quality of the active region causing the electroluminescence to be brighter. In a specific embodiment the super lattice also functions as a separate confinement heterostructure (SCH) in a laser diode. This superlattice is required for good epi quality, but will also help guide the optical mode for increased optical confinement within the gain-providing quantum well layers. In a specific embodiment, the superlattice is part of the waveguide. In a specific embodiment, the present method and device may be configured with the following.

1. The mode made be lossy or not optimized for modal gain if too few superlattice periods are used
   For 3% In content 65 superlattice periods are desired
   For 6% In content 35 superlattice periods are desired
   The mode is confined with only 20 superlattice periods for 9% and 12% In content
2. The mode is pulled out of the QWs for high numbers of superlattice periods
   For 9% In content the optimum number of periods is about 45 periods
   For 12% In content the optimum number of periods is about 35 periods
   Note: The above can be configured for regular SCH and HSSCH structures
3. The HSSCH gives higher gain, but the loss is lower in superlattice structures
4. The optimum design will be different for 5QW or 1QW structures.

The method and device here can be configured with conductive oxides, low temperature p-clad, n-contact scribes, beam clean-up scribes, among others. It can also include an indium tin oxide (ITO) or zinc oxide (ZnO) cladding region on top of a thin p-type layer such as p-GaN layer or region of 200 Å to 2000 Å for laser diodes or LEDs. Certain GaN planes may suffer from severe thermal degradation in the active region during growth of the electron blocking layer and the p-cladding layers where elevated temperatures are used. In certain embodiments, if ZnO or ITO is formed in place of a portion or substantially the p-clad layer or region, desirable p-type material can be achieved without subjecting the resulting device to a long growth time of the p-layer.

In a specific embodiment, the method and device can also include growth of a very low temperature p-cladding on top of the quantum well or light emitting layers. By developing epitaxial conditions that enable low resistance p-cladding sufficient for good device performance with a growth temperature of 700° C. to 800° C., 800° C. to 850° C., or 850° C. to 875° C. degradation to the quantum well or light emitting regions can be reduced.

The invention enables a cost-effective optical device for laser applications such as display technologies. The optical device can be manufactured in a relatively simple and cost effective manner. The laser device uses a semipolar gallium nitride material capable of achieve a green laser device. The laser device is capable of emitting long wavelengths such as those ranging from about 480 nm to about 540 nm, and also from about 540 nm to about 660 nm. In alternative embodiments, the laser device is capable of emitting blue wavelengths, e.g., those ranging from about 420 nm to about 480 nm.

BRIEF DESCRIPTION OF THE DRAWINGS

FIG. 2 illustrates electroluminescence output power for laser devices.

DETAILED DESCRIPTION

Figures 1, 1A, 2:
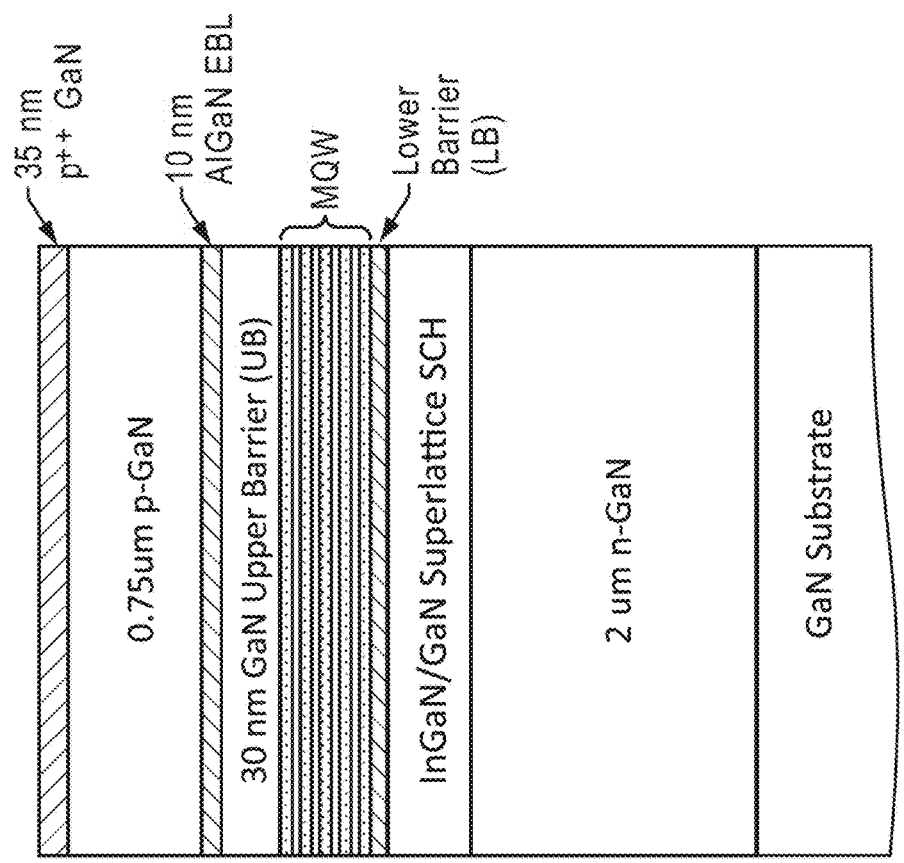
FIGS. 1A-1, 1A-2, 1B-1, and 1B-2 are diagrams of optical devices including growth regions.
Figures 1, 1A:
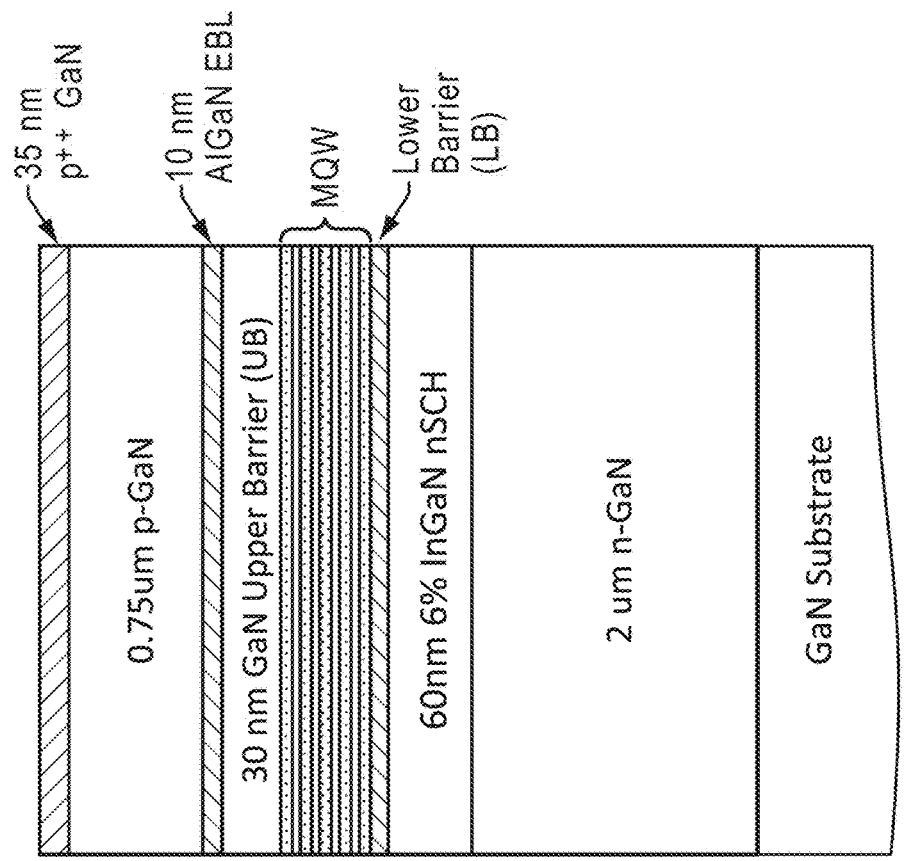

FIGS. 1A-1, 1A-2, 1B-1, and 1B-2 are diagrams of optical devices including growth regions according to an embodiment of the present invention. As shown, the laser diode is an epitaxial structure configured on a gallium and nitrogen containing substrate within a family of planes, e.g., (30-3-2), (20-2-1), (30-3-1), (30-32), (20-21), (30-31) or any orientation within +/−10 degrees toward c-plane and/or a-plane from these orientations. In a specific embodiment referring to FIG. 1A-1, the gallium nitride substrate includes an n-type gallium and nitride epitaxial region, an overlying InGaN nSCH region, a lower barrier region, a plurality of quantum well regions, an upper barrier region, an electron blocking region, a p-type gallium and nitrogen containing region, and an overlying p++ GaN contact region. Referring now to FIG. 1A-2, the gallium nitride substrate includes an n-type gallium and nitride epitaxial region, an overlying InGaN/GaN superlattice SCH region, a lower barrier region, a plurality of quantum well regions, an upper barrier region, an electron blocking region, a p-type gallium and nitrogen containing region, and an overlying p++ GaN contact region.

Figures 1, 1B, 2:
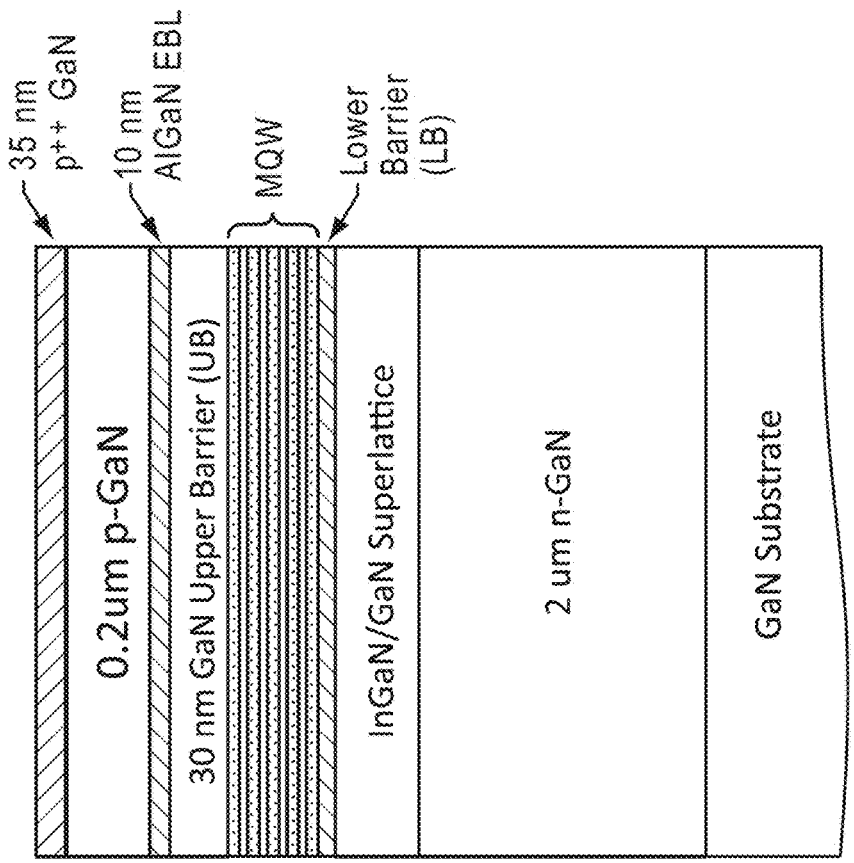
Figures 1, 1B:
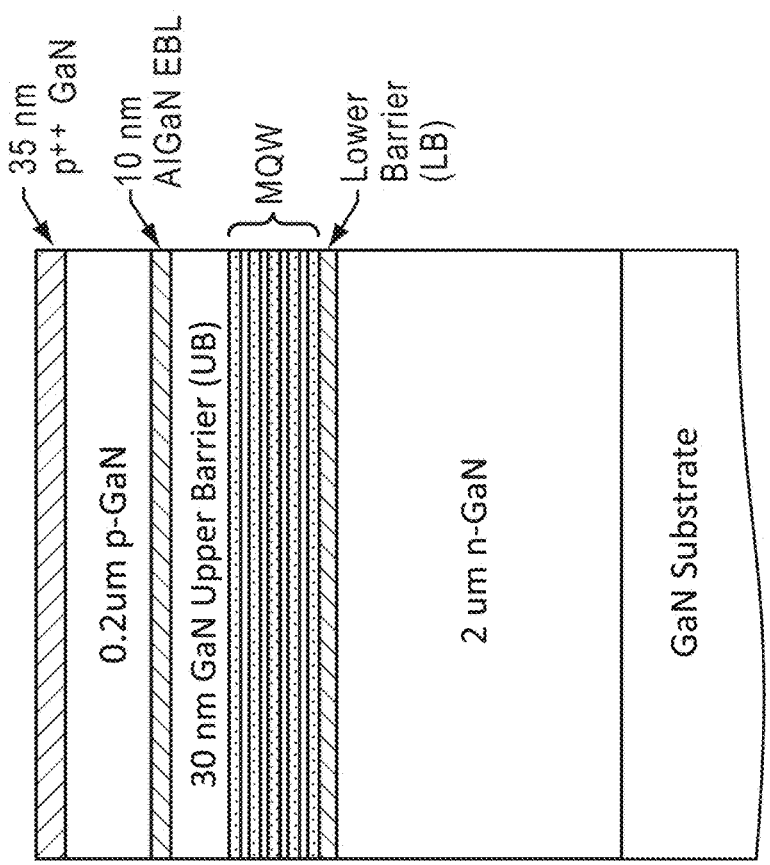
Figure 2:
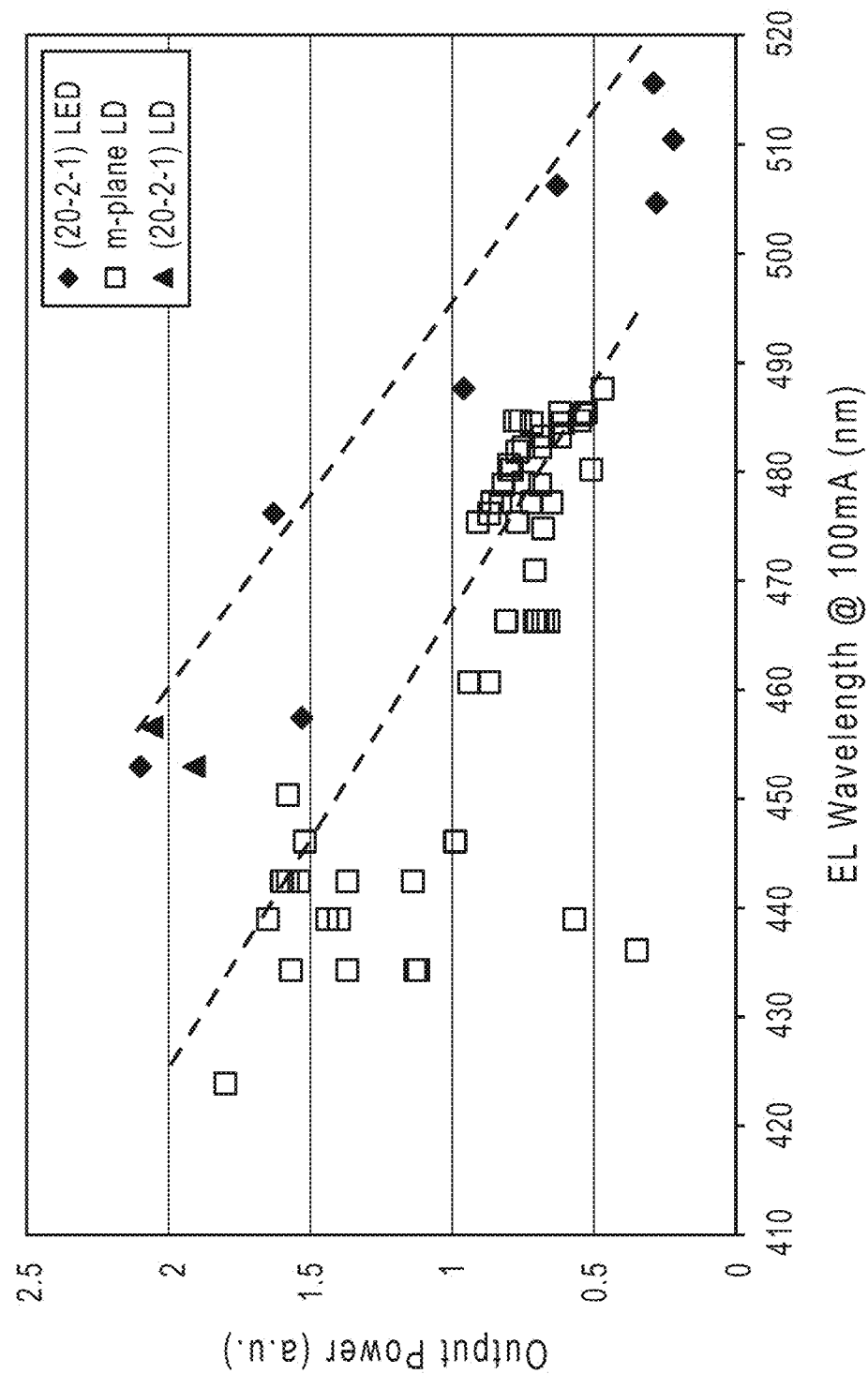

FIGS. 1B-1 and 1B-2 illustrate embodiments of other LED devices. The optical device is a laser diode epitaxial structure configured on a gallium and nitrogen containing substrate within a family of planes, e.g., (30-3-2), (20-2-1), (30-3-1), (30-32), (20-21), (30-31) or any orientation within +/−10 degrees toward c-plane and/or a-plane from these orientations. Referring to FIG. 1B-1 the gallium nitride substrate includes an n-type gallium and nitride epitaxial region, a lower barrier region, a plurality of quantum well regions, an upper barrier region, an electron blocking region, a p-type gallium and nitrogen containing region, and an overlying p++ GaN contact region. Referring to FIG. 1B-2, the gallium nitride substrate includes an n-type gallium and nitride epitaxial region, an overlying InGaN/GaN superlattice region, a lower barrier region, a plurality of quantum well regions, an upper barrier region, an electron blocking region, a p-type gallium and nitrogen containing region, and an overlying p++ GaN contact region.

FIG. 2 illustrates electroluminescence (EL) output power for laser device structures operated in LED mode at 100 mA of injected current according to embodiments of the present invention. As shown, the present device gallium and nitrogen containing structure configured on the (20-2-1) plane. The plot illustrates electroluminescence output power against electroluminescence wavelength at the operation current of 100 mA. As shown, the present device includes laser diodes using the above structures made using (1) (20-2-1), (2) (m-plane), and (3) (20-21). As shown, the laser diode structures on (20-2-1) have a certain output power, which is 30-75% higher than that of m-plane laser diode structures at an emission wavelength of 450 nm to 475 nm.

Figure 3:
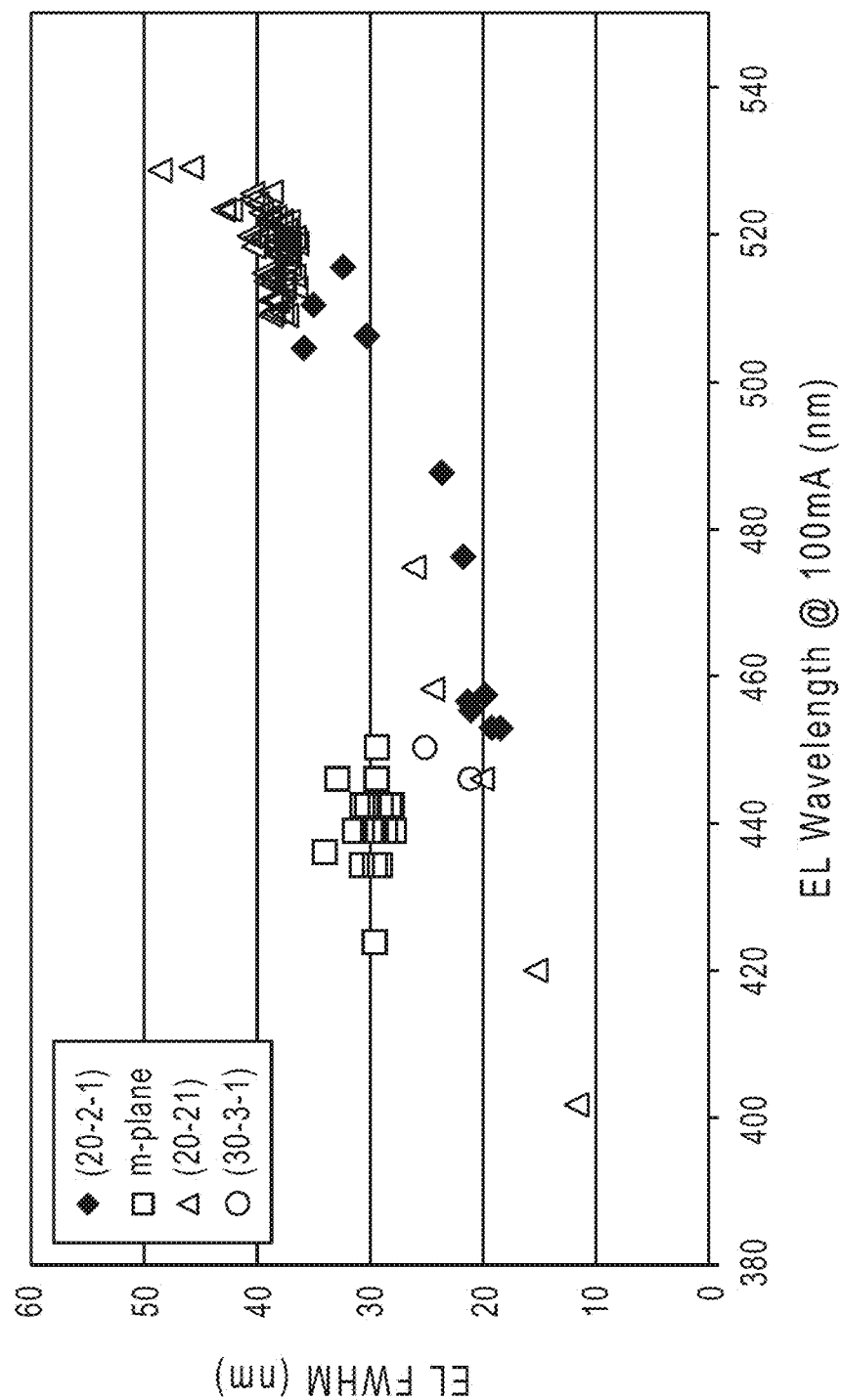
FIG. 3 illustrates electroluminescence spectral width properties for laser devices.

FIG. 3 illustrates electroluminescence (EL) spectral width properties for laser device structures operated in LED mode at 100 mA of injected current according to embodiments of the present invention. As shown, the device gallium and nitrogen containing structure configured on the (20-2-1) plane. The plot illustrates electroluminescence spectral width (FWHM) against electroluminescence wavelength. Shown are laser diodes using the above structures made using (1) (20-2-1), (2) (m-plane), (3) (20-21), and (4) (30-3-1). As shown, the laser diodes configured on (20-2-1) have the narrowest FWHM than the other planes across the full spectral width range indicating the material homogeneity will be high for potentially better gain properties and may be a good choice for blue and green laser diodes. The narrower FWHM of (20-21) and (30-3-1) over m-plane may also indicate the potential for improved laser diode performance.

Figure 4:
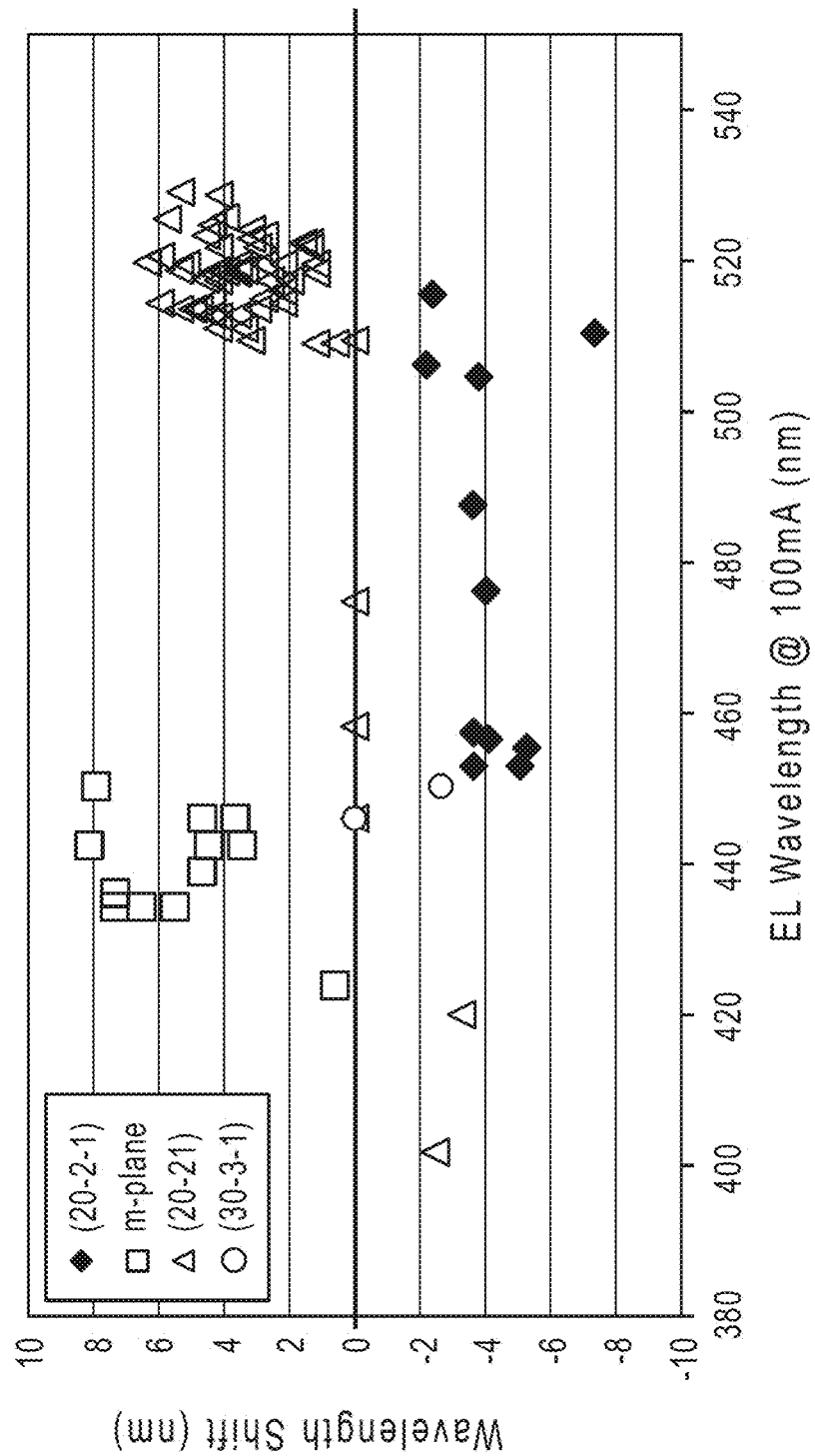
FIG. 4 illustrates electroluminescence wavelength shift characteristics.

FIG. 4 illustrates electroluminescence (EL) wavelength shift characteristics for laser device structures with injected currents of 100 mA to 1 A operated in LED mode according to embodiments of the present invention. The plot illustrates electroluminescence spectral width (FWHM) against electroluminescence wavelength. As shown, the present device includes laser diodes using the above structures made using (1) (20-2-1), (2) (m-plane), (3) (20-21), and (4) (30-3-1). As shown, in the blue wavelength regime of 440-480 nm the device structures grown on m-plane exhibit a strong peak wavelength blueshift from 100 mA to 1 A EL, which is likely due to inhomogeneous InGaN and is generally undesirable for gain in laser diodes. Alternatively, in the blue wavelength regime of 440 nm to 480 nm the device structures grown on (20-21), (30-3-1) and (20-2-1) exhibit no blueshift and even redshift on the (20-2-1)-plane, which possibly indicates reduced density of localized energy states and improved homogeneity. In the green (~520 nm) spectral range (20-21) exhibits a strong blue-shift, whereas (20-2-1) demonstrates a redshift which again indicates better material quality. Such improved material quality in terms of reduction of localized states, increased homogeneity, or other could lead to improved gain properties in the laser diode.

As an example, In InGaN-based diode lasers, inhomogeneous broadening—induced by disorder in the InGaN active region (AR)—is a key factor in determining performance. Large broadening damps the laser gain, and therefore implies higher threshold current density for similar laser cavity losses. This is especially critical for longer wavelength emission (l>450 nm), where the large fraction of In in the AR tends to make inhomogeneous broadening more problematic. Therefore, it is desirable to identify means to reduce inhomogeneous broadening, and methods to characterize it.

In a specific embodiment, the present method and devices uses absorption spectra to characterize inhomogeneous broadening. The two metrics include: (i) the slope of the absorption near the band-edge (a sharper absorption is related to more homogeneous material), and (ii) the Stokes shift between the band gap of absorption spectra and the photoluminescence peak wavelength (a large Stokes shift is typically related to localized states, which are more prevalent in disordered materials). In the following descriptions, we illustrated the different behavior of inhomogeneous broadening in m-plane, (20-21), and (20-2-1) samples grown under typical conditions.

Figure 5:
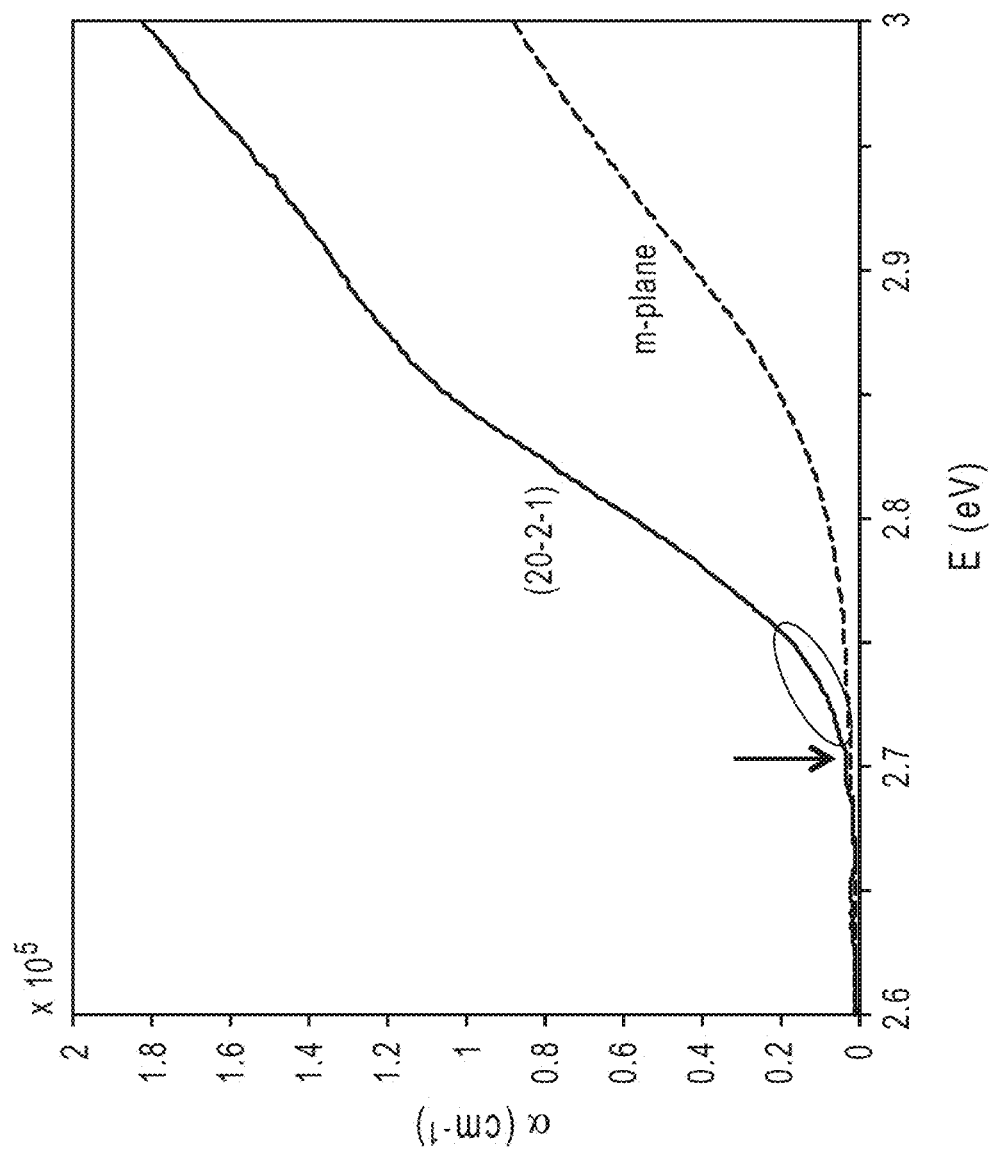
FIGS. 5 through 7 illustrate band edge adsorption data.
Figure 6:
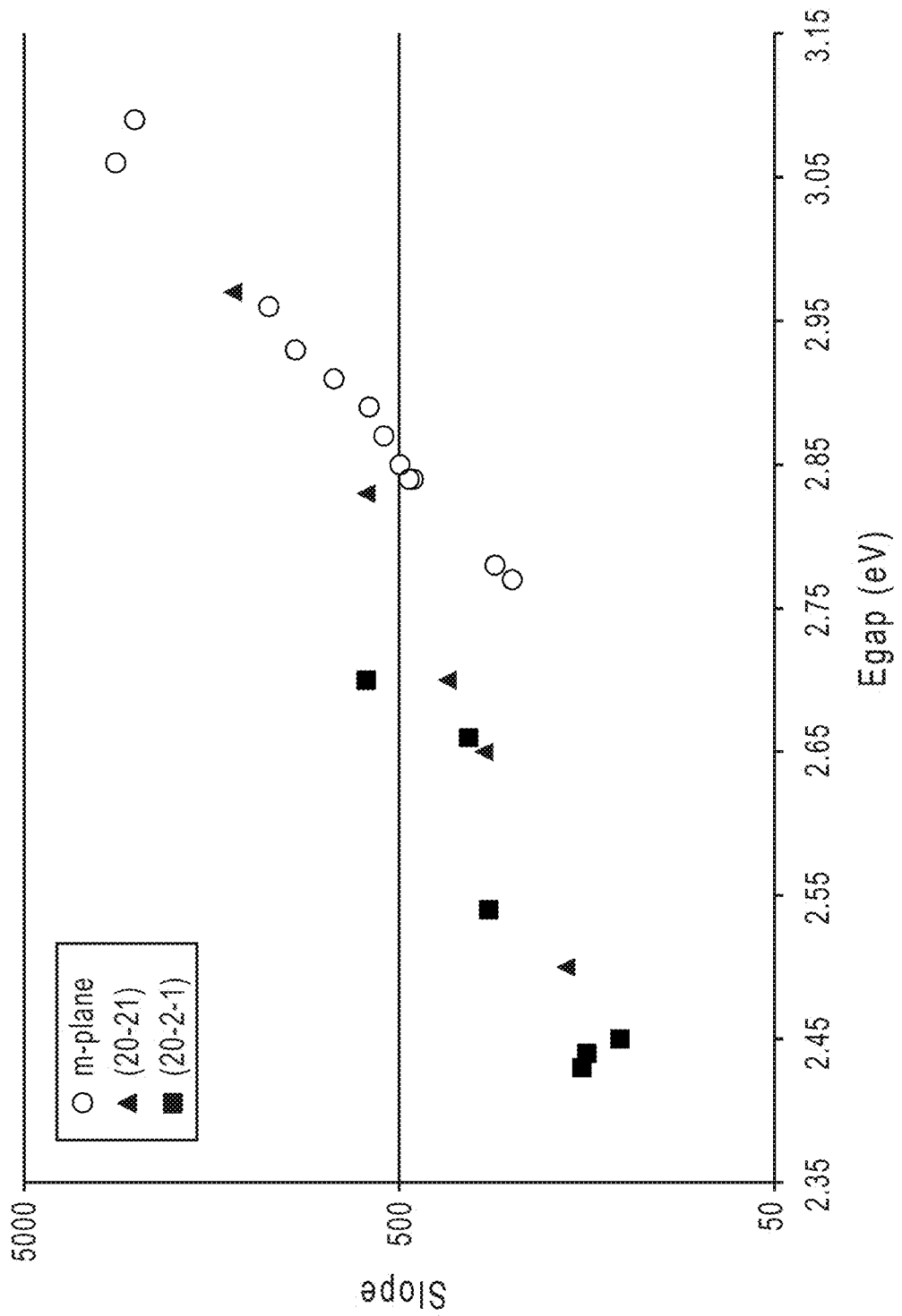
Figure 7:
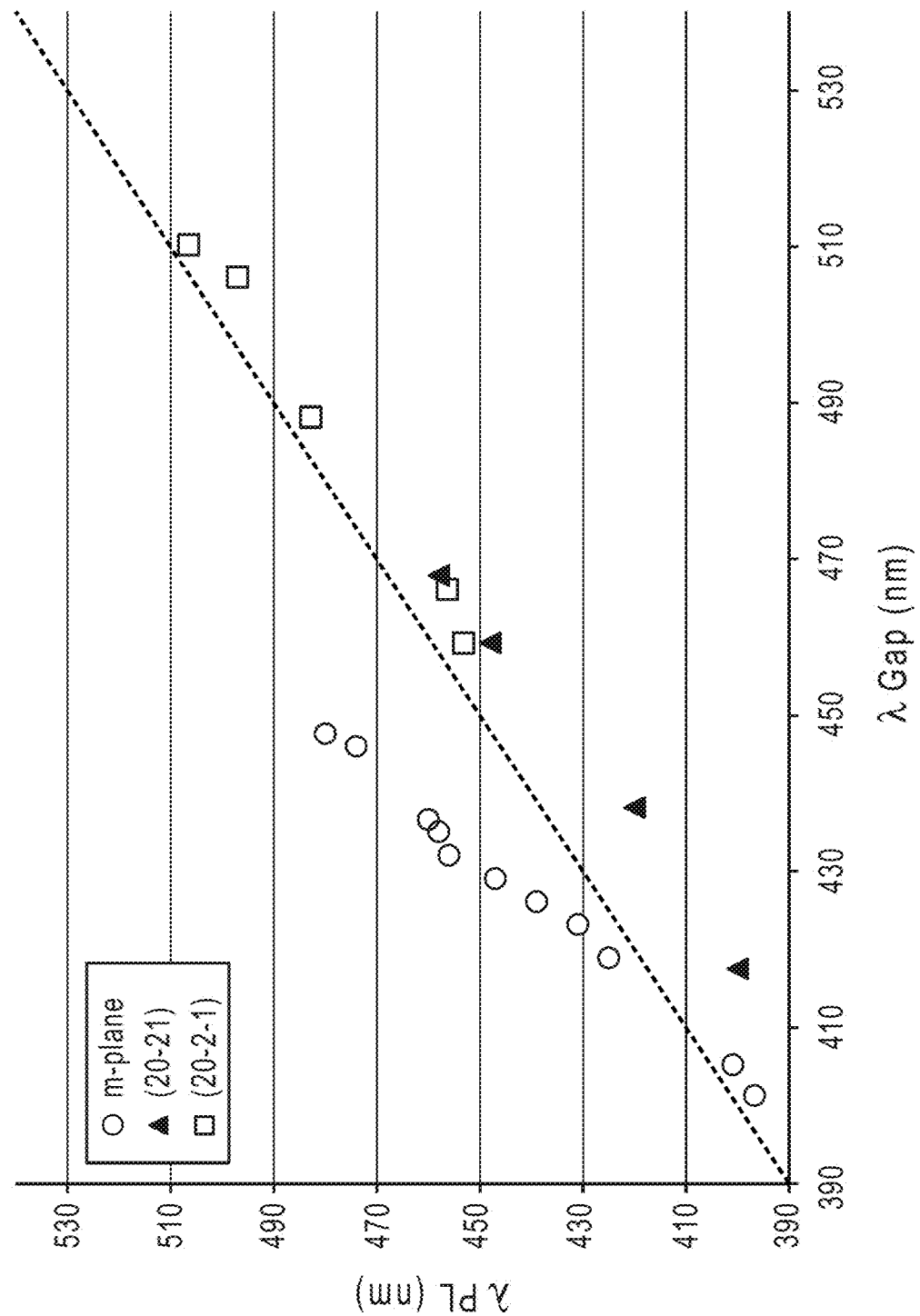

FIGS. 5 through 7 illustrate band edge adsorption data according to embodiments of the present invention. FIG. 5 illustrates an example of an absorption spectra of m-plane and (20-2-1) samples. The circle region is the absorption spectra, which is near the onset of absorption. The absorption spectra are, to first order, quadratic near the onset of absorption (circled region), and therefore can be characterized by a constant number such as the second derivative, which is referred to as the slope. The bandgap energy $E_{gap}$ is estimated from the onset of the absorption spectra (arrow). The second derivative of the absorption spectra will be called "slope" in the FIG. 6. The band gap energy, E gap in the FIG. 6, is estimated from the onset of the absorption spectra, where the arrow is.

FIG. 6 illustrates the slope of the absorption spectra as the function of bandgap energy (E gap) for the laser diodes grown on m-plane, (20-21) and (20-2-1). The lower slope value implies the inhomogeneous broadening in the MQW and thus degraded laser performance. At similar wavelength (bandgap energy), samples grown on (20-21) and (20-2-1) have higher slope value than the samples grown on m-plane. A lower bandgap energy indicates longer wavelength and a higher bandgap energy indicates a shorter wavelength. The higher slope for the structures grown on (20-21) and (20-2-1) implies a more homogeneous active region InGaN material than that grown on m-plane. In the long wavelength side, samples grown on (20-2-1) have higher slope value than samples on (20-21). This indicates that the InGaN quantum wells on the samples grown on (20-2-1) are likely more homogeneous than samples grown on (20-21) in the long wavelength side (small Egap side).

FIG. 7 illustrates the Stokes shift of samples grown on m-plane, (20-21) and (20-2-1). m-plane samples show an increasing Stokes shift at longer wavelength, suggesting an increasing amount of localized states. (20-21) shows a linear relationship between gap wavelength and photoluminescence wavelength in the violet to blue region. (20-2-1) shows a linear relationship between gap wavelength and photoluminescence wavelength all the way out to 510 nm, indicating it may be a desirable choice for a green laser diode.

Figure 8:
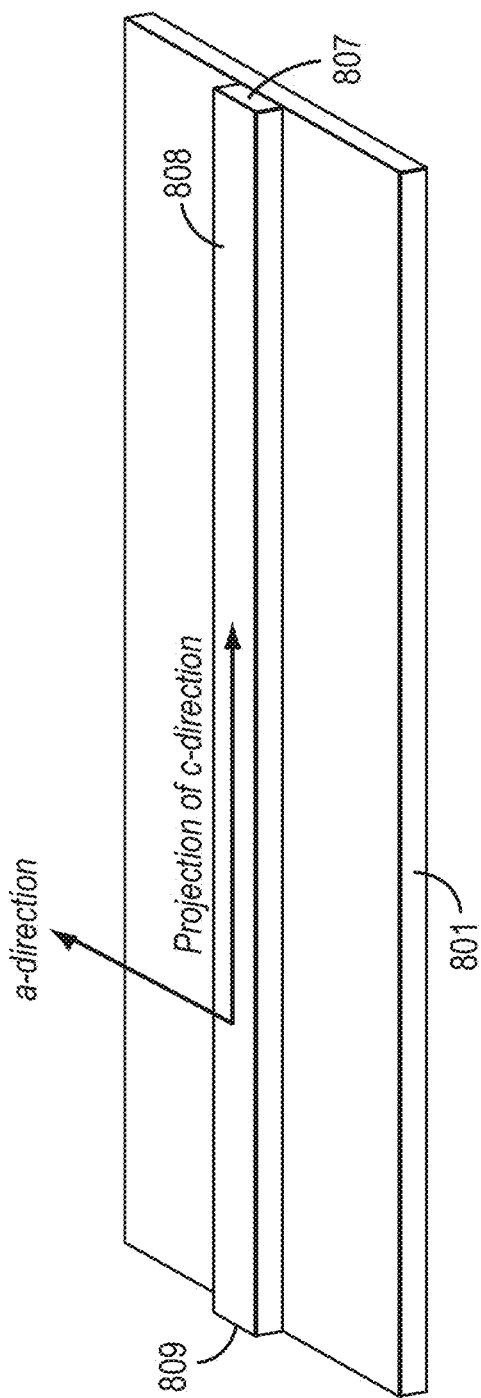
FIG. 8 is a diagram of a laser device.

FIG. 8 is a diagram of a laser device on a {20-2-1} plane, a {30-3-1} plane, or an offcut of these planes. As shown, the optical device includes a gallium nitride substrate member 801. In a specific embodiment, the gallium nitride substrate member is a bulk GaN substrate characterized by having a semipolar crystalline surface region, but can be others. In a specific embodiment, the bulk nitride GaN substrate comprises nitrogen and has a surface dislocation density between about 10E5 cm$^{-2}$ and about 10E8 cm$^{-2}$ or below 10E5 cm$^{-2}$. The nitride crystal or wafer may comprise $Al_xIn_yGa_{1-x-y}N$, where 0≤x, y, x+y≤1. In one specific embodiment, the nitride crystal comprises GaN. In one or more embodiments, the GaN substrate has threading dislocations, at a concentration between about 10E5 cm$^{-2}$ and about 10E8 cm$^{-2}$, in a direction that is substantially orthogonal or oblique with respect to the surface. As a consequence of the orthogonal or oblique orientation of the dislocations, the surface dislocation density is between about 10E5 cm$^{-2}$ and about 10E7 cm$^{-2}$ or below about 10E5 cm'. In a specific embodiment, the device can be fabricated on a slightly off-cut semipolar substrate as described in U.S. Ser. No. 12/749,466 filed on Mar. 29, 2010, which is incorporated by reference herein.

In a specific embodiment on the {20-2-1} GaN, the device has a laser stripe region formed overlying a portion of the off-cut crystalline orientation surface region. The laser stripe region is characterized by a cavity orientation substantially in a projection of a c-direction, which is substantially normal to an a-direction. The laser stripe region has a first end 807 and a second end 809 and is formed on a projection of a c-direction on a {20-2-1} gallium and nitrogen containing substrate having a pair of cleaved mirror structures which face each other. The cleaved facets provide a reflective coating, no coating, an antireflective coating, or expose gallium and nitrogen containing material.

In embodiments, the device has a first cleaved facet provided on the first end of the laser stripe region and a second cleaved facet provided on the second end of the laser stripe region. The first cleaved facet is substantially parallel with the second cleaved facet. Mirror surfaces are formed on each of the cleaved surfaces. The mirror surface of the first cleaved facet is provided by a top-side skip-scribe scribing and breaking process. The scribing process can use any suitable techniques, such as a diamond scribe or laser scribe. In a specific embodiment, the first mirror surface comprises a reflective coating. The reflective coating is selected from silicon dioxide, hafnia, and titania, tantalum pentoxide, zirconia, or combinations thereof. Depending upon the embodiment, the first mirror surface can also comprise an anti-reflective coating.

Also, in certain embodiments, the second cleaved facet comprises a second mirror surface provided by a top side skip-scribe scribing and breaking process. Preferably, the scribing is diamond scribed or laser scribed. In a specific embodiment, the second mirror surface comprises a reflective coating, such as silicon dioxide, hafnia, and titania, tantalum pentoxide, zirconia, combinations, and the like.

In certain embodiments, the device has a first cleaved facet provided on the first end of the laser stripe region and a second cleaved facet provided on the second end of the laser stripe region. The first cleaved facet is substantially parallel with the second cleaved facet. Mirror surfaces are formed on each of the cleaved surfaces. The mirror surface of the first cleaved facet is provided by a nicking and breaking process where a nick is induced in the semiconductor material using a laser scribe or diamond scribe. This nick behaves as a crack initiation site such that during the breaking process a crack is induced and propagates a cleavage place to form a cleaved facet. Guiding etches or scribes may be used to guide the cleavage plane along a predetermined direction. The nick scribing process can use any suitable techniques, such as a diamond scribe or laser scribe. In a specific embodiment, the first mirror surface comprises a reflective coating. The reflective coating is selected from silicon dioxide, hafnia, and titania, tantalum pentoxide, zirconia, or combinations thereof. Depending upon the embodiment, the first mirror surface can also comprise an anti-reflective coating.

Also, in certain embodiments, the second cleaved facet comprises a second mirror surface provided by a nicking and breaking process where a nick is induced in the semiconductor material using a laser scribe or diamond scribe. The nick behaves as a crack initiation site such that during the breaking process a crack is induced and propagates a cleavage place to form a cleaved facet. Guiding etches or scribes may be used to guide the cleavage plane along a predetermined direction. The nick scribing process can use any suitable techniques, such as a diamond scribe or laser scribe. In a specific embodiment, the second mirror surface comprises a reflective coating, such as silicon dioxide, hafnia, and titania, tantalum pentoxide, zirconia, combinations, and the like.

In certain embodiments, the device has a first etched facet provided on the first end of the laser stripe region and a second etched facet provided on the second end of the laser stripe region. The first etched facet is substantially parallel with the second etched facet. Mirror surfaces are formed on each of the etched surfaces. The mirror surface of the first etched facet is provided by a lithography and etching process where the etching process is selected from one of the following of chemical assisted ion beam etching (CAIBE), reactive ion etching (RIE), or inductively coupled plasma (ICP) etches. In a specific embodiment, the first mirror surface comprises a reflective coating. The reflective coating is selected from silicon dioxide, hafnia, and titania, tantalum pentoxide, zirconia, or combinations thereof. Depending upon the embodiment, the first mirror surface can also comprise an anti-reflective coating.

Also, in certain embodiments, the second etched facet comprises a second mirror surface provided by a lithography and etching process a lithography and etching process where the etching process is selected from one of the following of chemical assisted ion beam etching (CAIBE), reactive ion etching (RIE), or inductively coupled plasma (ICP) etches. In a specific embodiment, the second mirror surface comprises a reflective coating, such as silicon dioxide, hafnia, and titania, tantalum pentoxide, zirconia, combinations, and the like.

The laser stripe has a length from about 50 microns to about 3000 microns, but is preferably between 400 microns and 1000 microns. The stripe also has a width ranging from about 0.5 microns to about 50 microns, but is preferably between 0.8 microns and 3 microns. In a specific embodiment, the overall device has a width ranging from about 0.5 microns to about 15.0 microns. In a specific embodiment, the width is substantially constant in dimension, although there may be slight variations. The width and length are often formed using a masking and etching process, which are commonly used in the art.

This invention provides an optical device structure capable of emitting 501 nm and greater (e.g., 525 nm) light in a ridge laser embodiment. The device preferably includes: (1) a gallium and nitrogen containing substrate configured with a {20-2-1} surface region, (2) an InGaN separate confinement heterostructure, (3) a gallium nitrogen barrier layer(s), (4) a plurality of InGaN quantum wells (2 to 7), (5) a gallium nitrogen barrier layer(s), (6) an AlGaN electron blocking layer, (7) a p-type gallium nitrogen cladding layer, and (8) a p+ gallium nitrogen contact layer.

Figure 9:
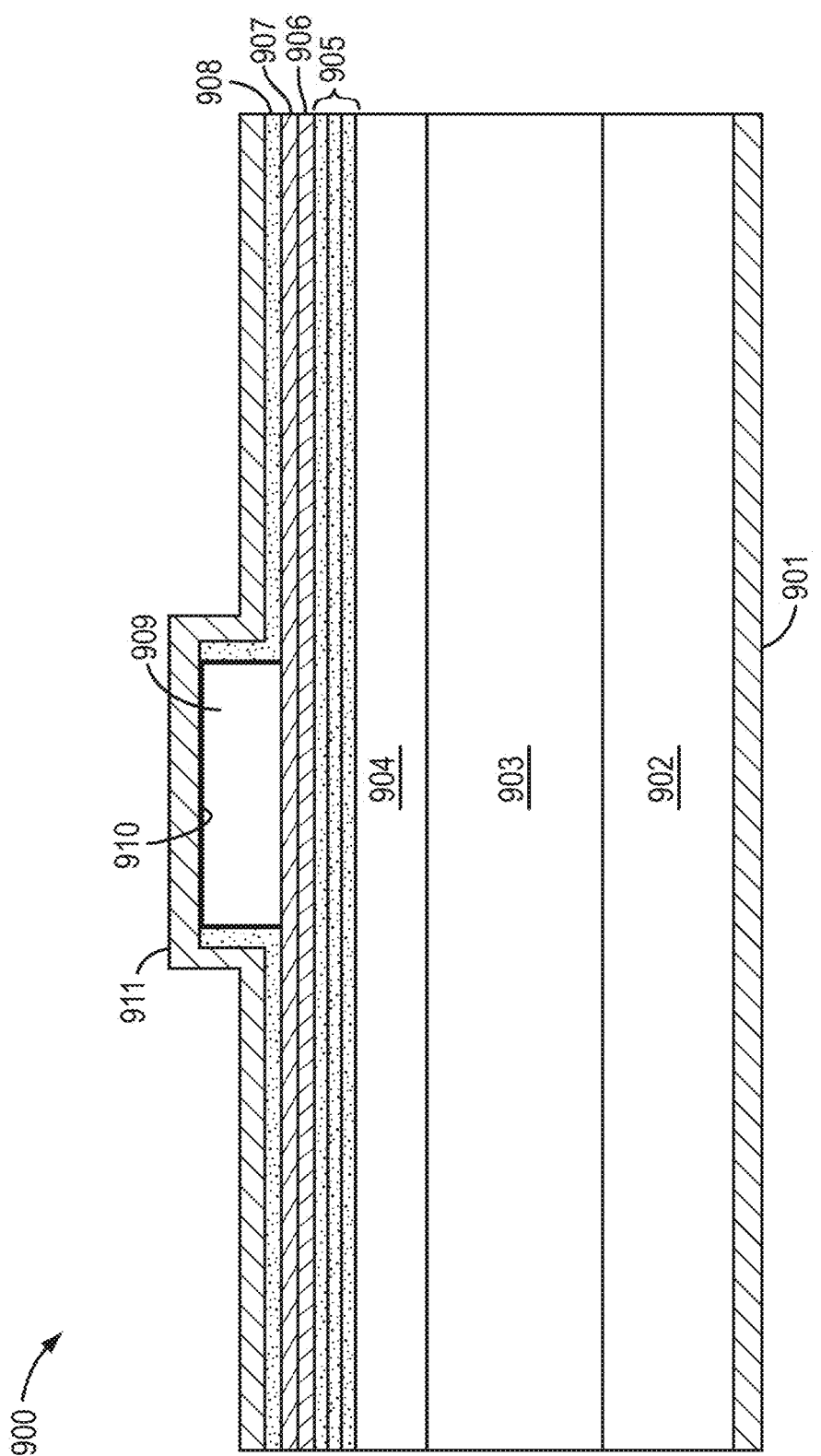
FIG. 9 is a cross-sectional diagram of a laser device.

FIG. 9 is a cross-sectional diagram of the laser device according to an embodiment of the present invention. FIG. 9 shows semipolar laser diode 900 including, backside n-contact metal 901, Gan substrate 902, nGaN layer 903, n-type separate confinement heterostructure 904, multiple quantum well region 905, guiding layer 906 such as an InGaN or GaN guiding layer, electron blocking layer 907, insulating layer 908, pGaN stripe 909, p-metal contact 910, and p-pad metal 911.

Figure 10:
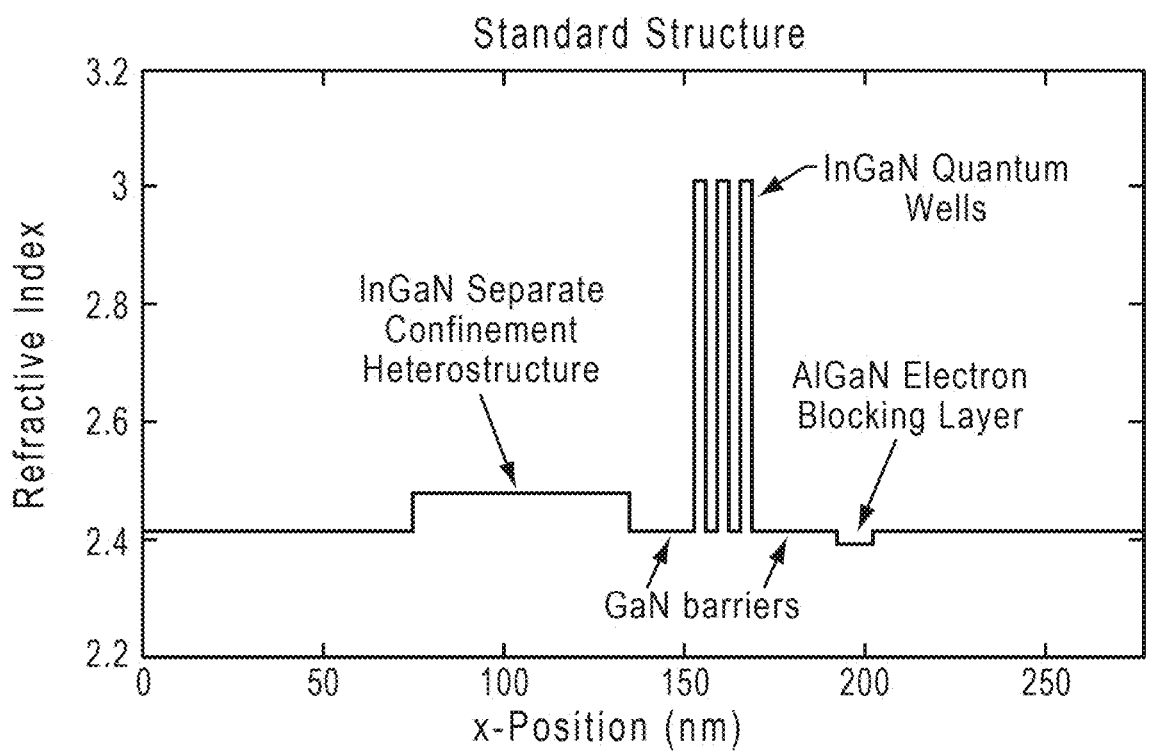
FIG. 10 is a refractive index diagram of a laser device.

FIG. 10 is a simplified refractive index diagram of a laser structure. As shown, the laser structure includes a gallium and nitrogen containing substrate configured in a certain plane (20-2-1) orientation, an InGaN separate confinement heterostructure, a plurality of InGaN quantum wells, and an AlGaN electron blocking layer. Barrier layers including GaN are also included.

Figure 11:
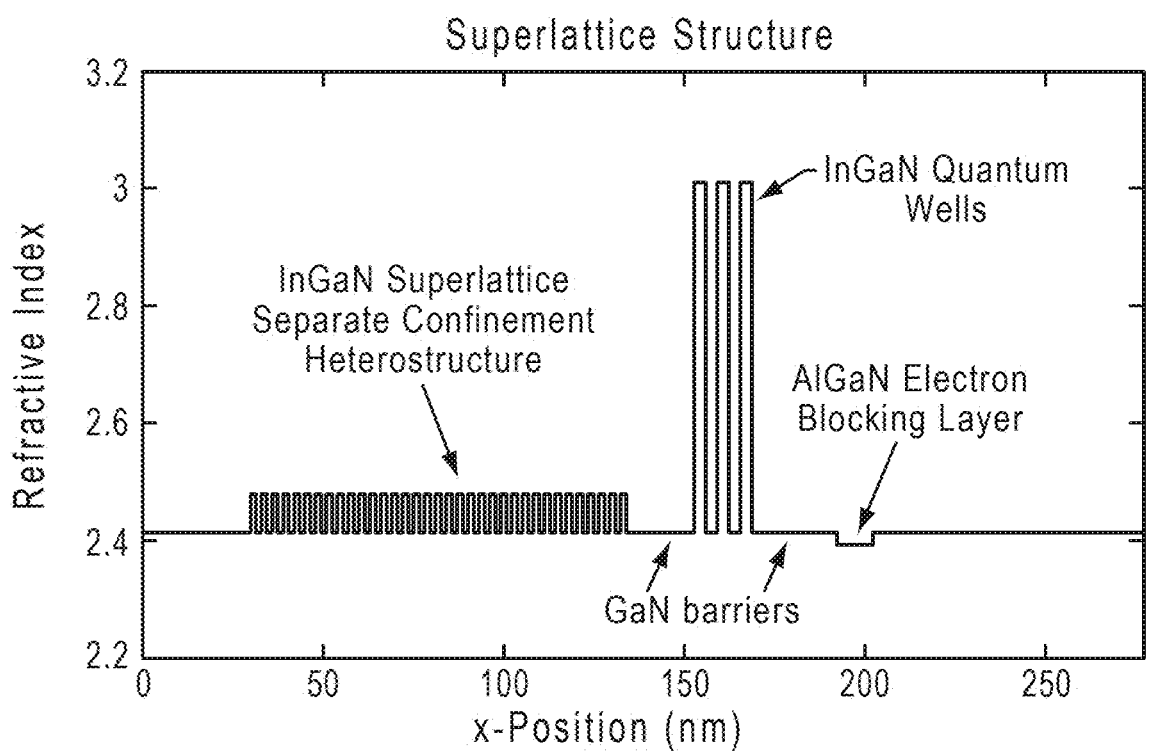
FIG. 11 is a refractive index diagram of a super lattice structure for a laser device.

FIG. 11 is a refractive index diagram of a laser structure with an InGaN/GaN super lattice structure according to an alternative embodiment of the present invention. The superlattice structure is used in place of or in addition to the SCH region to assist with optical mode confinement. As shown, the superlattice structure includes a gallium and nitrogen containing substrate configured in a certain plane (20-2-1) orientation, an InGaN superlattice separate confinement heterostructure, a plurality of InGaN quantum wells, and an AlGaN electron blocking layer. Barrier layers including GaN are also included.

In a specific embodiment, the present device and method includes various indium content in the super-lattice, as noted below, and a number of superlattice periods. Examples of variations according to the present invention can be found throughout the present specification and more particularly below.

Figure 12A:
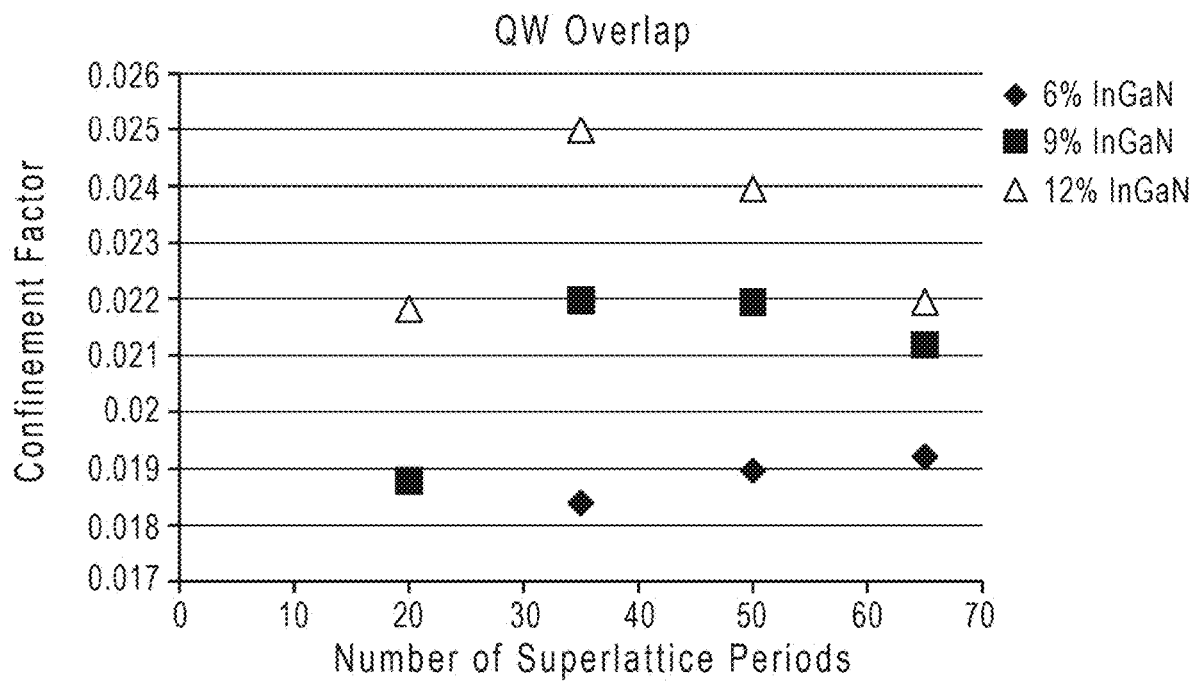
FIGS. 12A and 12B illustrates confinement factors and p-type cladding loss characteristics of laser devices.
Figure 12B:
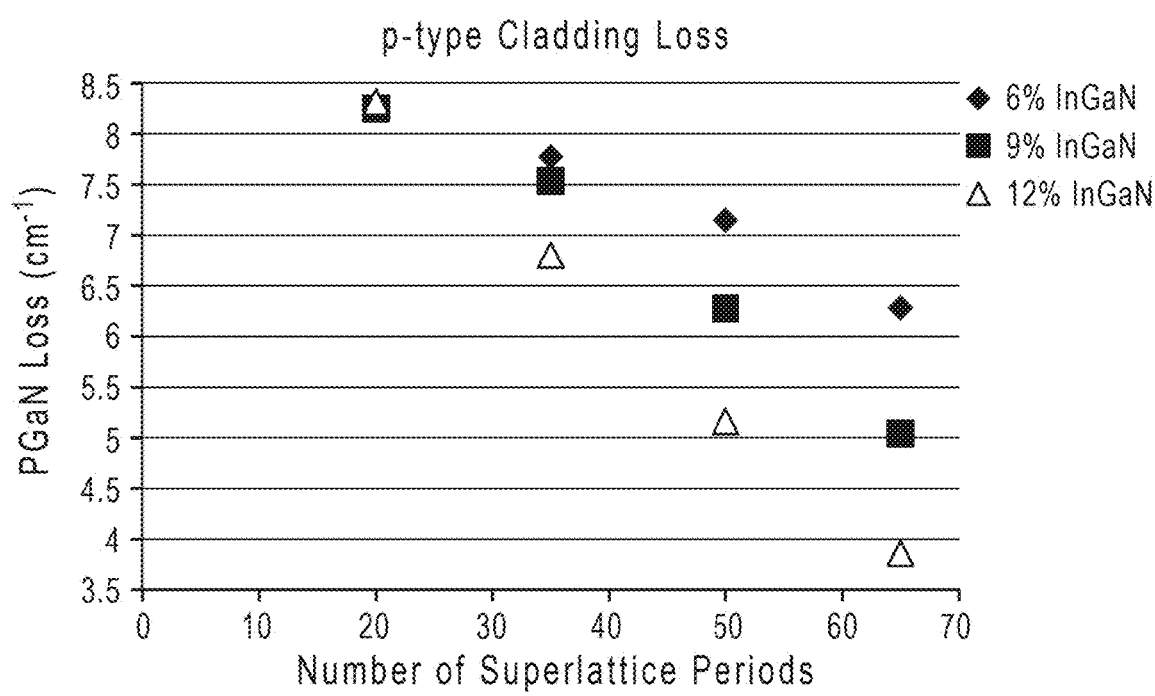

1. Vary the In content in the superlattice from 3% to 12%
$In_{0.03}Ga_{0.97}N$ (n=2.4456)
$In_{0.06}Ga_{0.94}N$ (n=2.4788)
$In_{0.09}Ga_{0.91}N$ (n=2.5146)
$In_{0.12}Ga_{0.88}N$ (n=2.5542)
2. Vary the number of superlattice periods
20 periods
35 periods
50 periods
65 periods FIGS. 12A and 12B illustrate confinement factors and estimated optical losses associated with absorption in the p-cladding loss characteristics of laser devices. FIG. 12A shows a plot of confinement factor (quantum well overlap) against a number of superlattice periods for various indium contents, e.g., 6%, 9%, 12%. As also shown, FIG. 12B shows a plot of p-cladding loss against a number of superlattice periods for the various indium contents, e.g., 6%, 9%, 12%. Also shown are the following:

Compare to standard SCH (60 nm $In_{0.06}Ga_{0.94}N$):
Confinement factor=0.0203
PGaN Loss=8.20 $cm^{-1}$
Compare to HSSCH (30 nm $In_{0.13}Ga_{0.87}N$/10 nm GaN/30 nm $In_{0.13}Ga_{0.87}N$):
Confinement factor=0.0297
PGaN Loss=6.49 $cm^{-1}$ As noted, we have demonstrated the superlattice structure, standard SCH, and HSSCH. In a specific embodiment, a ridge waveguide is fabricated using a certain deposition, masking, and etching processes. In a specific embodiment, the mask is comprised of photoresist (PR) or dielectric or any combination of both and/or different types of them. The ridge mask is 1 micron to 2.5 microns wide for single lateral mode applications or 2.5 µm to 30 µm wide for multimode applications. The ridge waveguide is etched by ion-coupled plasma (ICP), reactive ion etching (ME), or other method. The etched surface is 5 nm to 250 nm above the active region. A dielectric passivation layer is then blanket deposited by any number of commonly used methods in the art, such as sputter, e-beam, PECVD, or other methods. This passivation layer can include $SiO_2$, $Si_3N_4$, $Ta_2O_5$, or others. The thickness of this layer is 80 nm to 400 nm thick. An ultrasonic process is used to remove the etch mask which is covered with the dielectric. This exposes the p-GaN contact layer. P-contact metal is deposited by e-beam, sputter, or other deposition technique using a PR mask to define the 2D geometry. The contact layer can be Ni/Au but others can be Pt/Au or Pd/Au.

In certain embodiments, the present laser device (e.g., 510 nm to 550 nm) achieves desirable wall plug efficiencies. That is, the wall-plug-efficiencies can be greater than 3%, greater than 5%, greater than 7% and greater than 10% at output powers of over 60 mW. In a specific embodiment, the laser device (e.g., 430 nm to 480 nm) achieves desirable wall plug efficiencies. That is, the wall-plug-efficiencies can be greater than 15%, greater than 20%, greater than 25% and greater than 30% at output powers of over 60 mW. In an alternative embodiment, the laser device (e.g., 430 nm to 480 nm) achieves desirable wall plug efficiencies. That is, the wall-plug-efficiencies can be greater than 15%, greater than 20%, greater than 25% and greater than 30% at output powers of over 1.5 W.

It has been discovered that certain semipolar planes are more susceptible to thermal degradation of the light emitting active region during the subsequent growth of the p-type layers above the active region such as electron blocking layers, p-cladding layers, and p-contact layers. This thermal degradation characteristic results in reduced brightness or optical output power from the light emitting region using photoluminescence or electroluminescence measurements. The reduced brightness indicates reduced internal efficiency of the material due to the introduction of defects that act as non-radiative recombination centers. Such non-radiative recombination centers ultimately reduce device efficiency and can even prevent laser diode operation.

Figure 13:
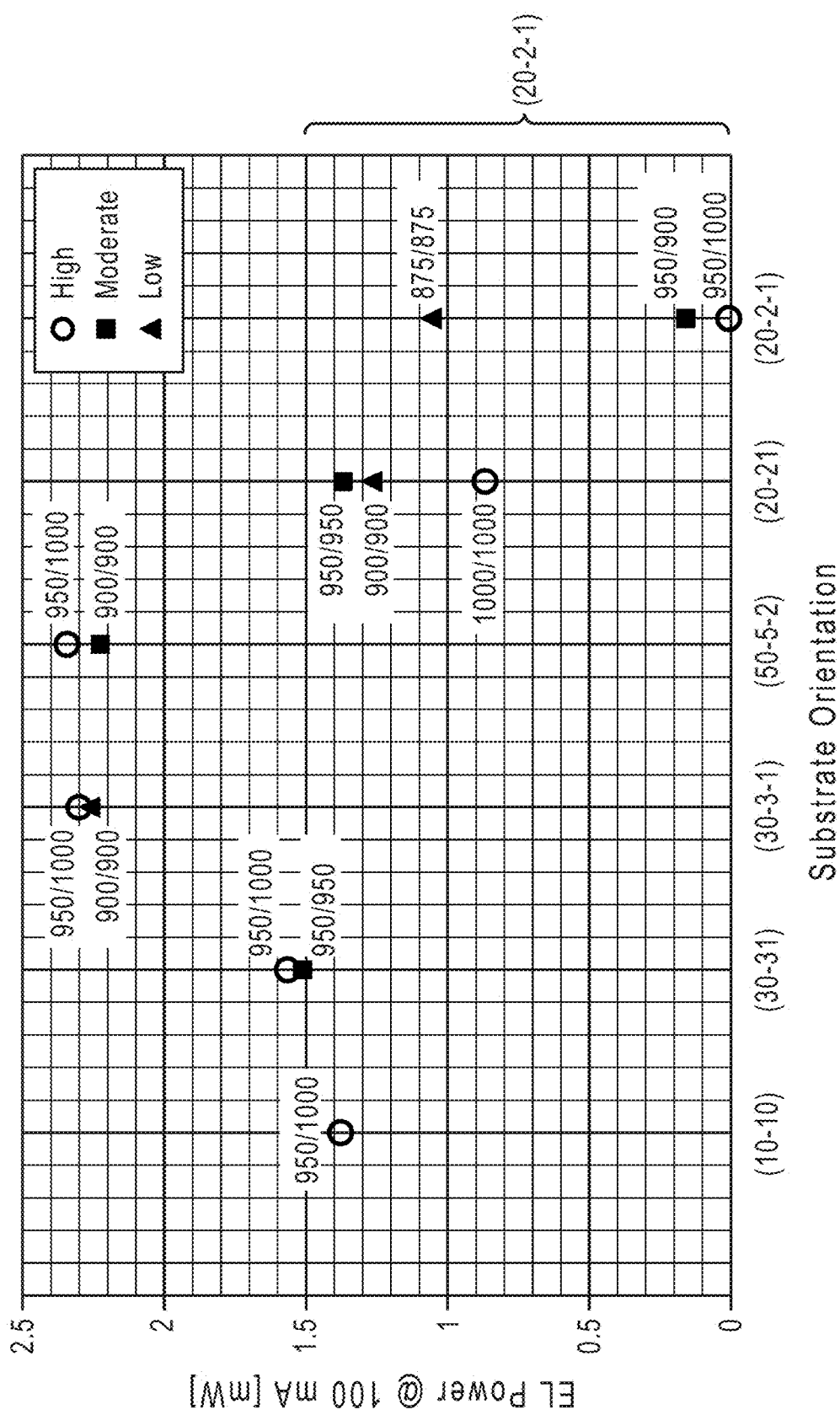
FIG. 13 is a simplified plot illustrating effects of growth temperature of electron blocking layer (EBL) and p-cladding layer(s) on the electroluminescence (EL) brightness for alternative crystallographic planes for optical devices.

To demonstrate this thermal degradation FIG. 13 presents a simplified plot illustrating the effects of growth temperature of the electronic blocking layers (EBL) and p-cladding layer(s) on the electroluminescence (EL) brightness for alternative nonpolar and semipolar planes for optical devices. The laser device structures used blue emitting (440 nm to 455 nm) active regions with quantum well thicknesses of 50 Å to 60 Å on the several orientations of GaN. Light collection geometry was kept constant for all measurements. Numbers by data points indicate growth temperature in degrees Celsius of the EBL/p-cladding. As clearly illustrated by this figure, certain semipolar planes such as (20-2-1) are very susceptible to active region degradation with the growth of the p-cladding layers. For (20-2-1) with an EBL/p-clad growth temperature of 950° C./900° C., the EL brightness was reduced to less than 10% of that of the same structure grown with an EBL/p-clad growth temperature of 875° C./875° C. When the growth temperature of the EBL/p-clad was increased to 1000° C./1000° C. the EL brightness was even further reduced. The (20-21) oriented device shows an EL brightness reduction from 1.4 mW to 0.9 mW when the EBL/p-clad growth temperatures are increased from 950° C./950° C. to 1000° C./1000° C. The alternate planes shown in FIG. 13 such as (30-31), (30-3-1), (50-5-2), and (10-10) do not show such a drastic EL brightness reduction with increased growth temperature of the EBL and the p-cladding layers.

In an embodiment for lasers or LEDs fabricated on a family of planes including, but not limited to, (30-3-2), (20-2-1), (30-3-1), (30-32), (20-21), (30-31) or any orientation within +/−10 degrees toward c-plane and/or a-plane from these orientations, the epitaxial device structure would contain a thin, 5 nm to 20 nm, 20 nm to 100 nm, 100 nm to 300 nm p-type region grown above the light emitting or quantum well regions. This thin p-type layer or layers may be characterized by a p-type cladding layer, an electron blocking layer, some combination, or other and could be comprised of GaN, AlGaN, InGaN, or InAlGaN and doped with a p-type species such as magnesium. Ultra-thin layers in this range grown at temperatures below, about equal to, or only slightly hotter (10° C. to 75° C.) than the growth temperature used for the light emitting layers would mitigate the thermal degradation to the light emitting layers that occurs when the layers are grown hotter or thicker. The reduced thermal degradation is a result of the relatively short growth time and the low growth temperature required for deposition of the thin p-clad layer. The benefit would perhaps be greater for a laser diode since much thicker p-type cladding layers are required in a laser diode compared to an LED, and therefore one would expect a larger degree of thermal degradation to the active region during the growth of the p-clad in a laser structure.

After the epitaxial growth is completed by MOCVD or other method such as MBE, one or more conducting oxide layers such as indium-tin-oxide (ITO) or zinc oxide (ZnO) would then be deposited directly on or generally above the thin p-cladding layer. These conducting oxide layers can be deposited at a temperature lower than a typical p-cladding growth temperature and even substantially lower than the growth temperature of the light emission region. This will prevent or drastically reduce any thermal degradation to the light emission region that would have occurred during the epitaxial growth of the conventional p-cladding region. The resulting conducting oxide layer can act as a p-cladding region in both laser and LED structures and can enable the formation of a good p-contact on top of the conducting oxide layer that results in ohmic or quasi-ohmic characteristics. Additionally, the conducting oxide layers can have optical absorption coefficients in the blue and green wavelength ranges of interest that are lower or significantly lower than the optical absorption coefficient of a typical highly doped epitaxial p-type cladding regions such as GaN or AlGaN, and may therefore help to reduce optical absorption for lower internal losses in a laser cavity or higher extraction efficiency in an LED device. In an alternative embodiment, metallic layers such as silver may be used in place of conducting oxide layers.

In another embodiment for lasers or LEDs fabricated on a family of planes including, but not limited to, (30-3-2), (20-2-1), (30-3-1), (30-32), (20-21), (30-31) or any orientation within +/−10 degrees toward c-plane and/or a-plane from these orientations, the epitaxial device structure would contain a p-type cladding region grown at very low growth temperature while still enabling an acceptable voltage characteristic within the device. The p-cladding layer could be comprised of GaN, AlGaN, InGaN, or InAlGaN and could be doped with a species such as magnesium. The very low growth temperature would be less than, equal to, or only slightly higher (10° C. to 50° C.) than the growth temperature used for the light emitting layers. More typically, the p-cladding region is grown at temperatures more than 50° C., more than 100° C., or more than 150° C. hotter than the light emitting layers. The substantially lower growth temperature would mitigate degradation to the light emitting layers that typically occurs when the layers are grown hotter or thicker. In a laser diode structure, the growth conditions, layer thickness, and layer composition would be designed to enable a laser device operable below 7V, operable below 6V, or operable below 5V. In an LED structure, the growth conditions, layer thickness, and layer composition would be designed to enable an LED device operable below 6V, operable below 5V, or operable below 4V, or operable below 3.5V.

Figure 14:
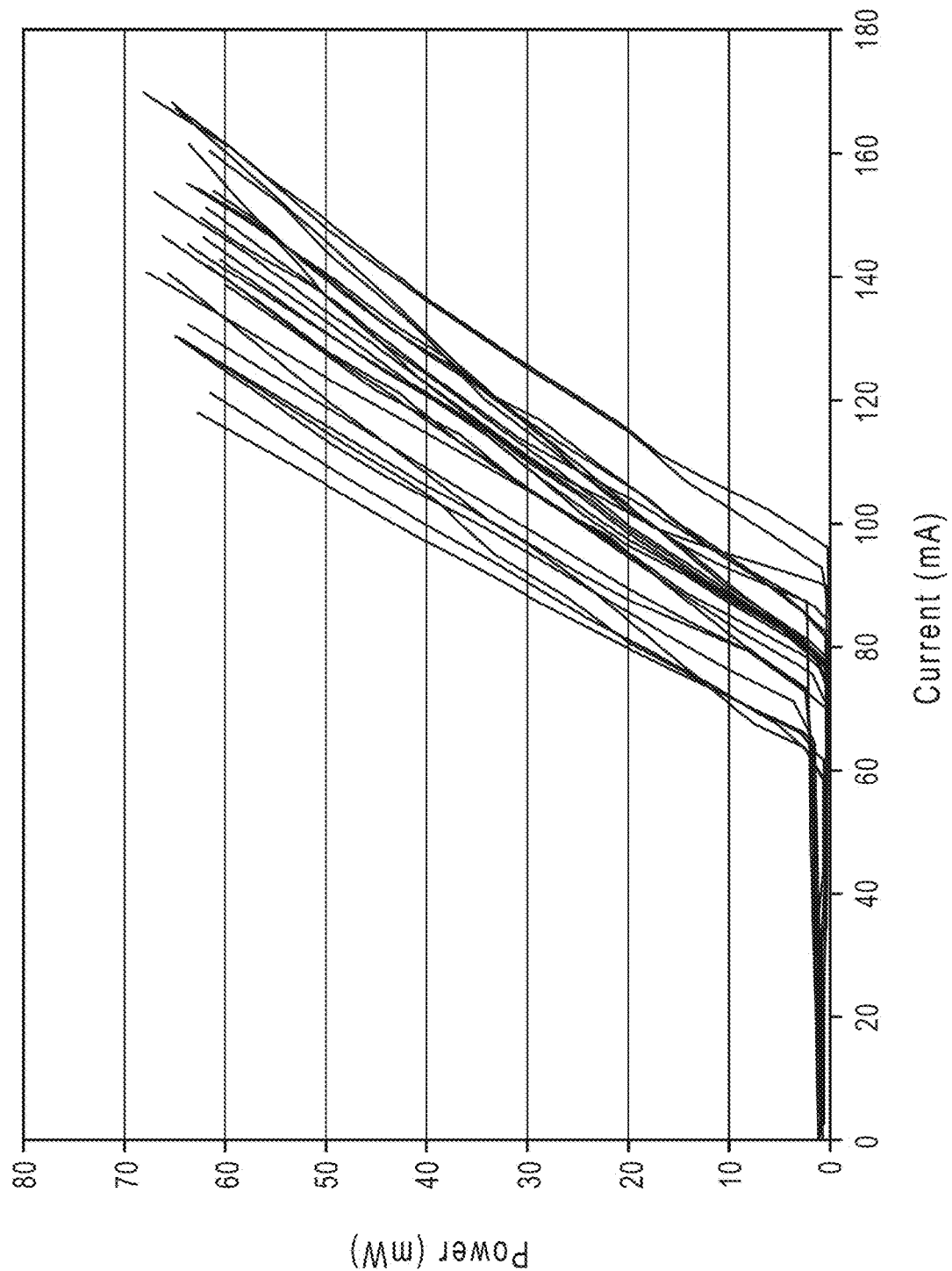
FIG. 14 illustrates data for blue lasers fabricated on (20-2-1) substrates.

FIG. 14 presents pulsed light versus current of single mode blue laser diodes fabricated on (20-2-1) substrates. As shown, the blue lasers exhibit threshold currents in the 50 to 90 mA range and generate over 60 mW of optical output power.

Figure 15:
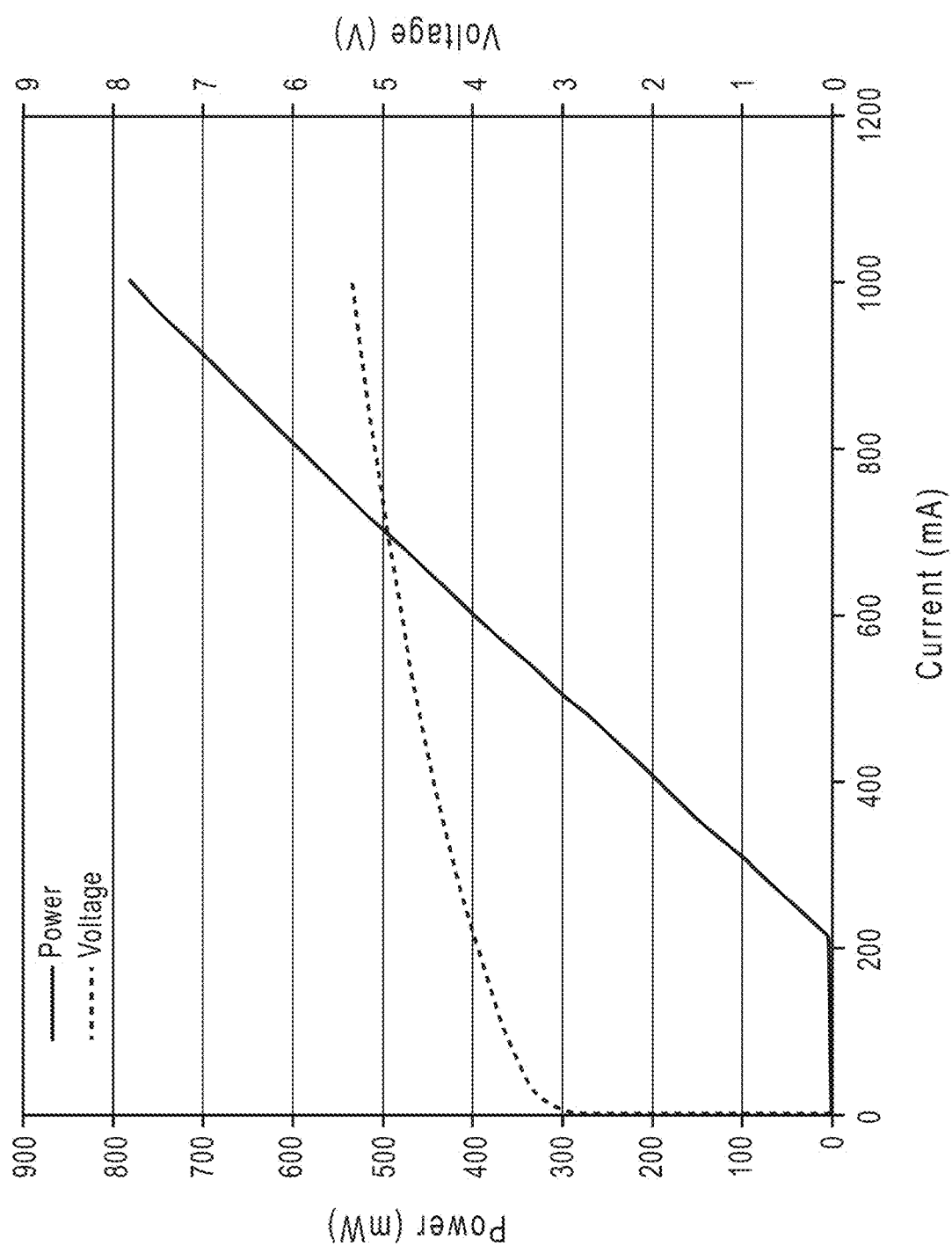
FIG. 15 illustrates data for a blue laser fabricated on a (30-3-1) substrate.

FIG. 15 presents continuous wave light versus current of a high power multi-mode blue laser diode fabricated on a (30-3-1) substrate. As shown, the blue laser exhibits a threshold current of 220 mA range and generates nearly 800 mW of optical output power at 1 Å of electrical input current.

Figure 16:
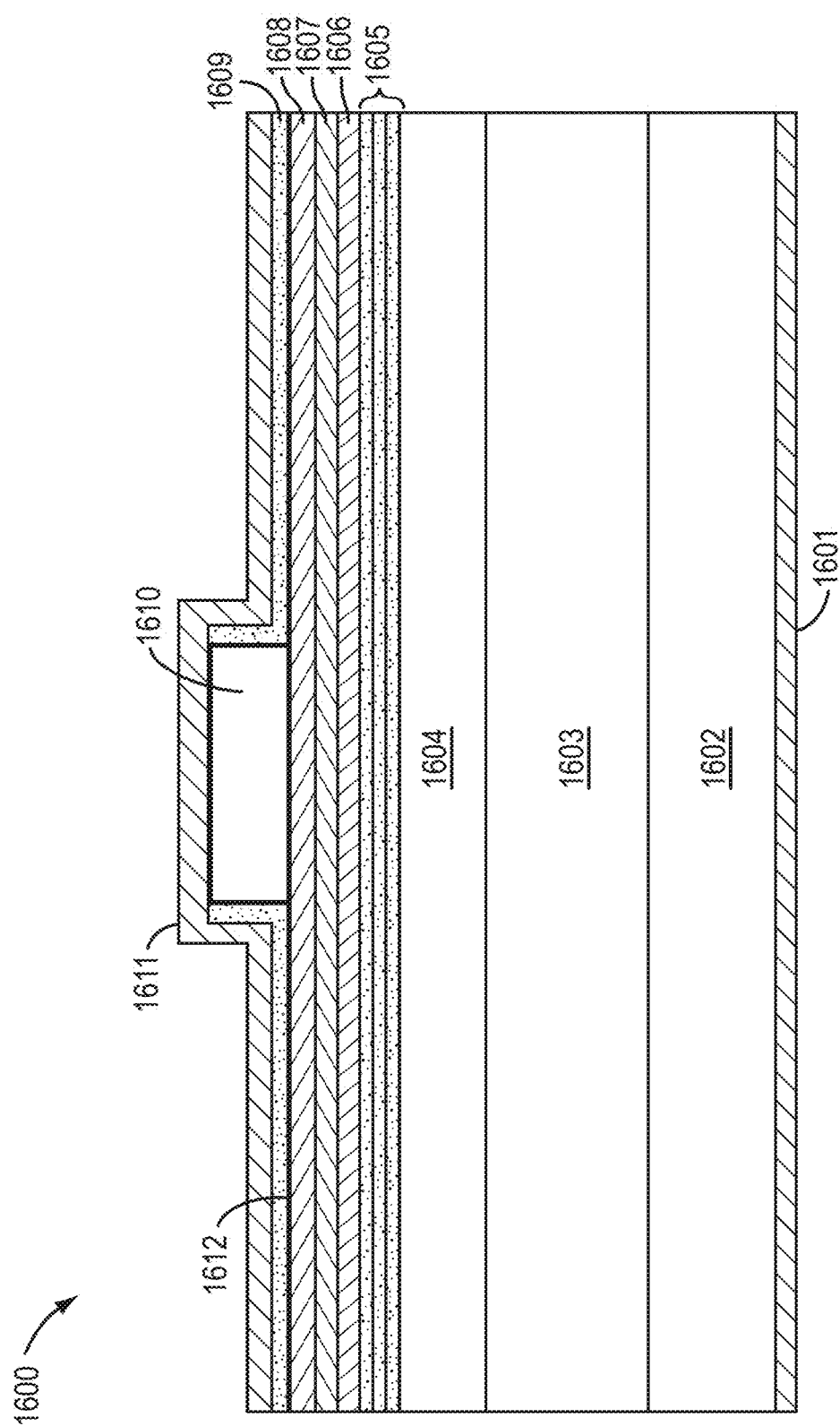
FIG. 16 shows an example of schematic cross-section diagram of a laser diode with a conductive oxide layer that comprises a substantial portion of the p-type cladding region.

FIG. 16 shows an example schematic cross-section diagram of a laser diode with a conductive oxide layer that comprises a substantial portion of the p-type cladding region. In this embodiment the waveguide stripe region is comprised entirely of the conductive oxide such that it forms all of the lateral index contrast to provide the lateral waveguide. As an example, the conductive oxide can be an indium tin oxide, or other suitable material. FIG. 16 shows device 1600 including backside n-contact metal 1601, GaN substrate 1602, n-cladding 1603 such as a nGaN or nAlGaN cladding, separate confinement heterostructure 1604, multi-quantum well region 1605, guiding layer 1606 such as an InGaN or GaN guiding layer, electron blocking layer 1607, p-cladding layer 1608 such as a pGaN layer, insulating dielectric layer 1612, conductive oxide 1610 such as indium tin oxide, and p-pad metal 1611.

Figure 17:
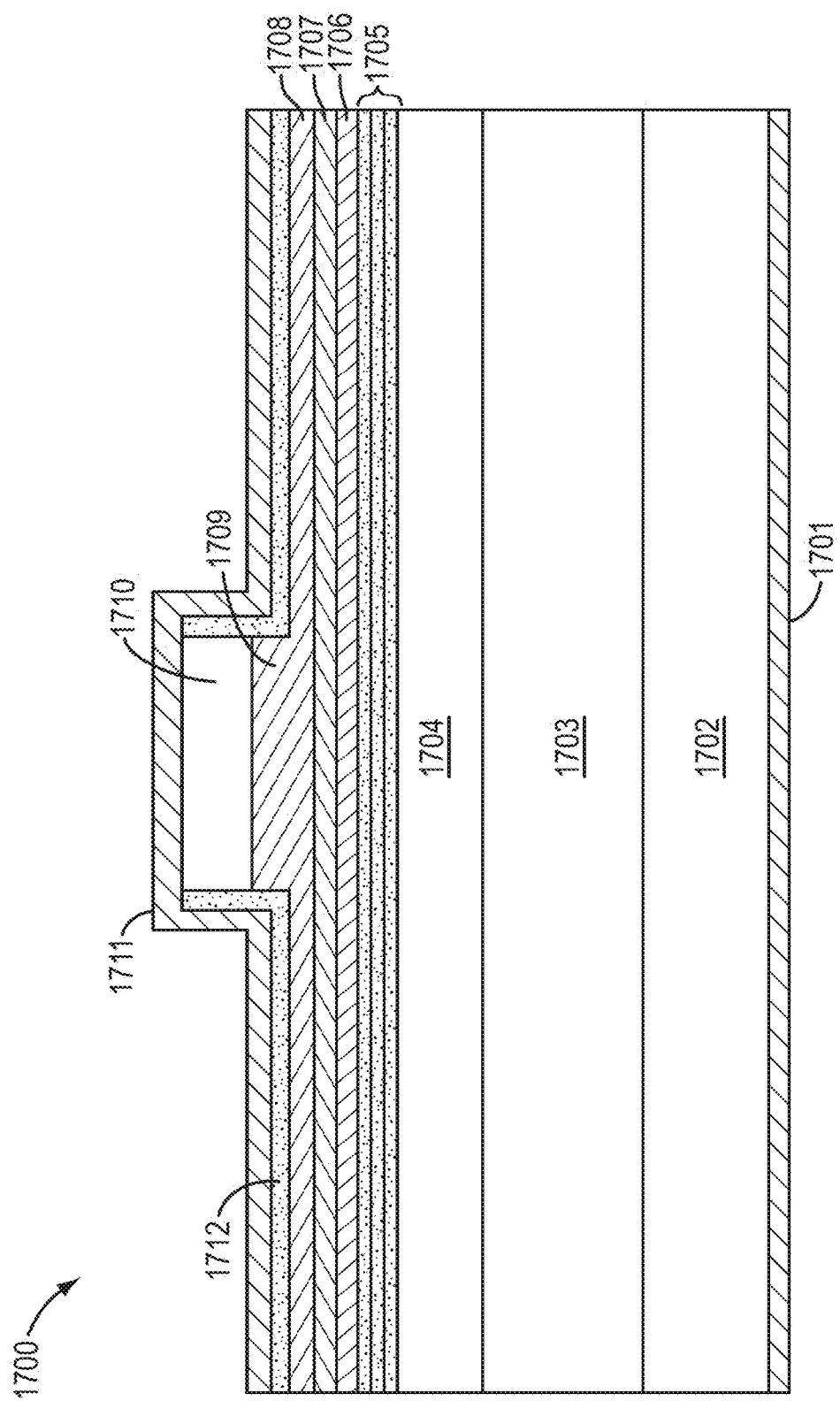
FIG. 17 shows another example schematic of a cross-section diagram of a laser diode with a conductive oxide layer that comprises a substantial portion of the p-type cladding region.

FIG. 17 shows another example schematic of a cross-section diagram of a laser diode with a conductive oxide layer that comprises a substantial portion of the p-type cladding region. In this embodiment the waveguide stripe region is comprised of a combination of a conductive and an epitaxially deposited p-type material such as p-type GaN, AlGaN, InAlGaN, or other gallium and nitrogen containing materials. In this embodiment the conductive oxide and the epitaxially formed p-type material provides the lateral index contrast to provide the lateral waveguide. FIG. 17 shows device 1700 including backside n-contact metal 1701, GaN substrate 1702, n-cladding 1703 such as a nGaN or nAlGaN cladding, separate confinement heterostructure 1704, multi-quantum well region 1705, guiding layer 1706 such as an InGaN or GaN guiding layer, electron blocking layer 1707, p-cladding layer 1708 such as a pGaN layer, insulating dielectric layer 1712, conductive oxide 1710 such as indium tin oxide, and p-pad metal 1711.

Figure 18:
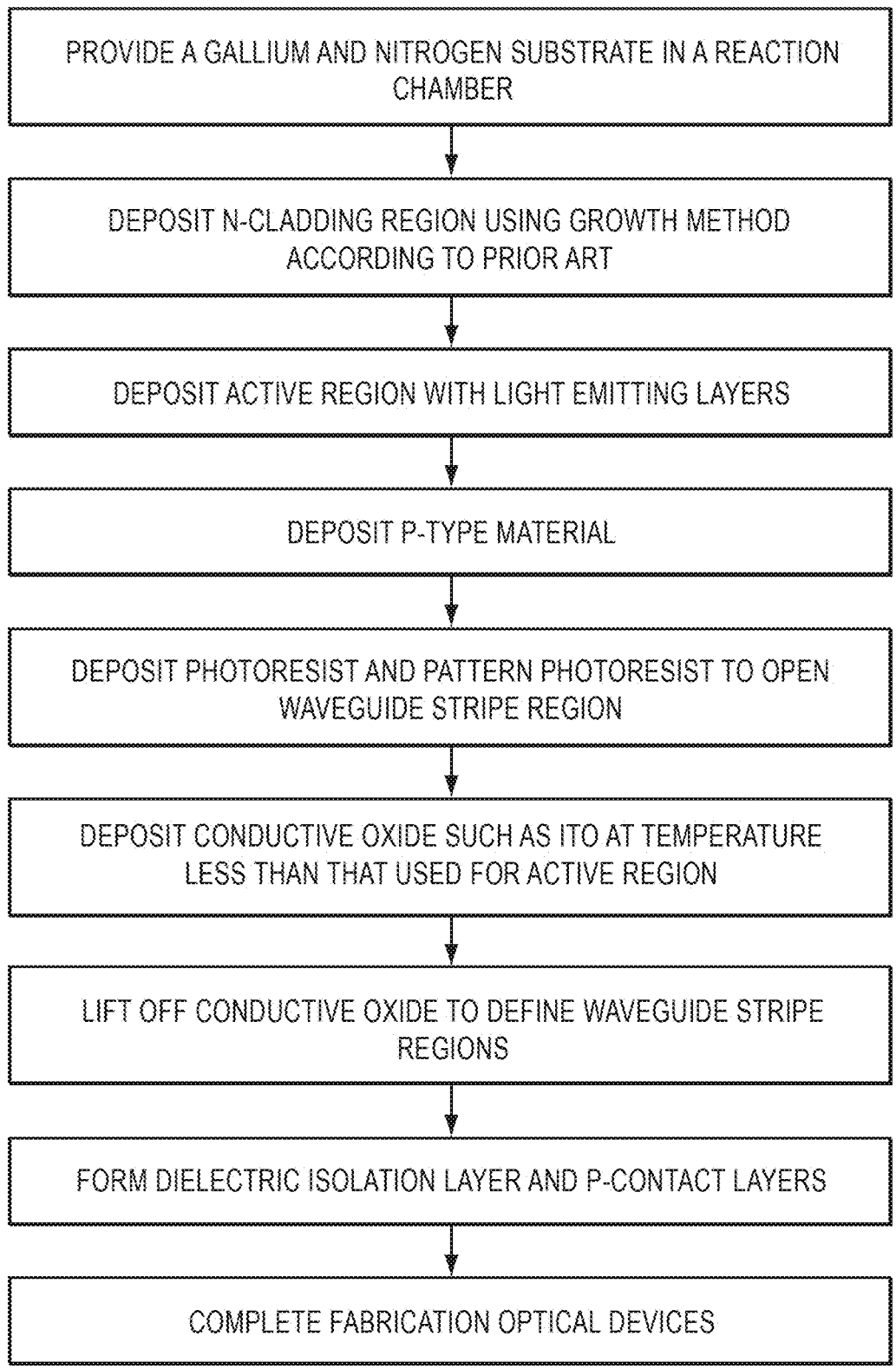
FIG. 18 provides an example process flow for forming a laser diode with a conductive oxide layer that comprises a substantial portion of the p-type cladding region.

FIG. 18 provides an example process flow for forming a laser diode with a conductive oxide layer that comprises a substantial portion of the p-type cladding region. In this example the epitaxially grown wafer is subjected to a photolithography process that would result in openings in the photoresist where the desired lasers stripes will be positioned. Following the photolithography the conductive oxide layer is deposited on the patterned wafer. The deposition methods could include sputtering, electron cyclotron resonance (ECR) deposition, or various other evaporation methods. The ECR deposition occurs at a rate of 1-3 angstroms per second, provides an ohmic contact to the p-layer it is deposited on, and provides a suitable sheet resistance for and absorption coefficient for forming an electrically conductive and low optical loss cladding region. This is followed by a lift-off process where the conductive oxide on top of the photoresist is removed from the wafer to result in laser stripe regions defined by the remaining conductive oxide stripes. In this embodiment the conductive oxide stripe region forms all of the lateral index contrast to provide the lateral waveguide.

Figure 19:
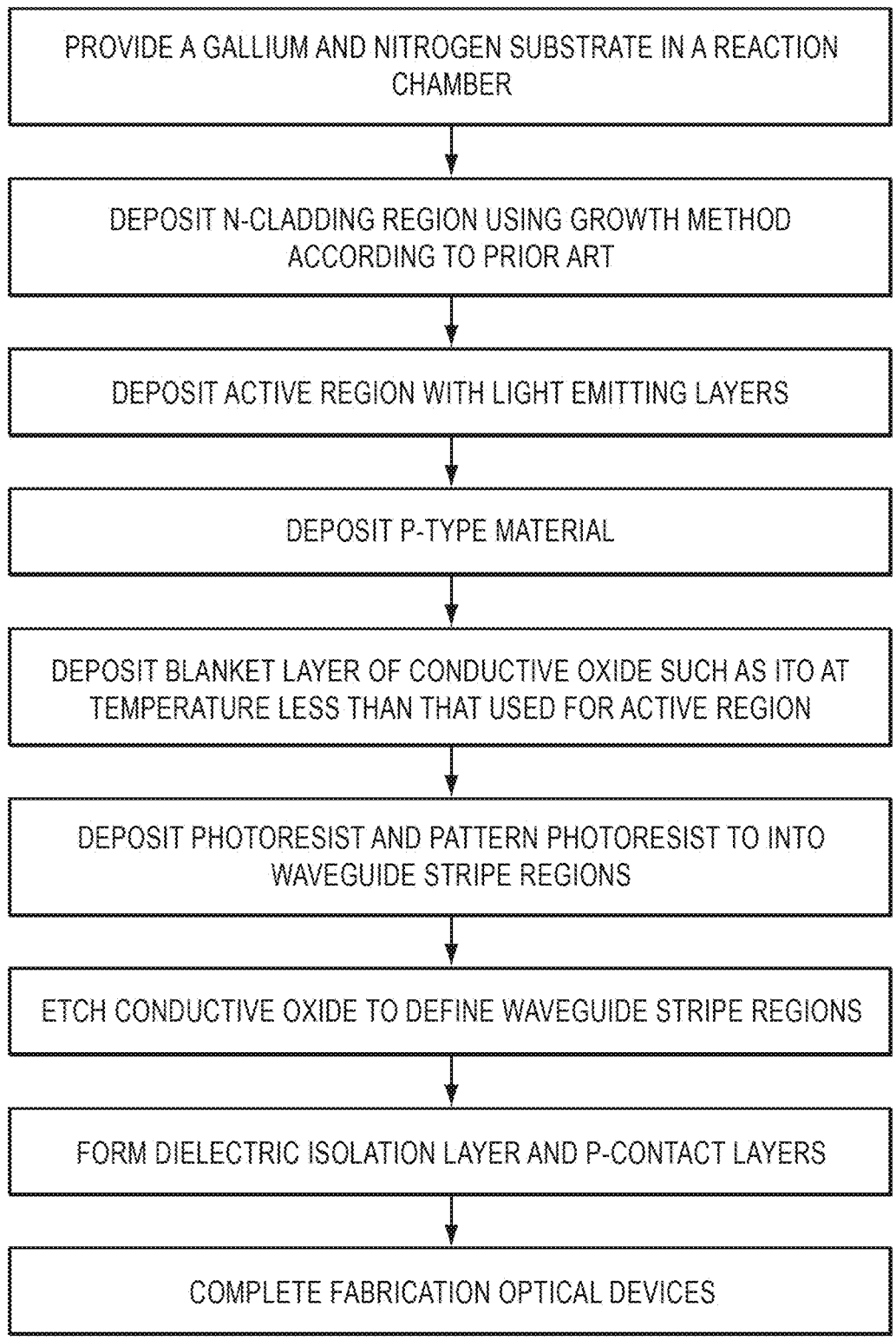
FIG. 19 provides an alternative example process flow for forming a laser diode with a conductive oxide layer that comprises a substantial portion of the p-type cladding region.

FIG. 19 provides an alternative example process flow for forming a laser diode with a conductive oxide layer that comprises a substantial portion of the p-type cladding region. In this example the epitaxially grown wafer is subjected to a blanket deposition of a conductive oxide layer. The deposition methods could include sputtering, electron cyclotron resonance (ECR) deposition, or various other evaporation methods. Following the deposition a photolithography process is used to define laser stripe patterns in the photoresist where the desired lasers stripes will be positioned. Following the photolithography step and etching process is carried out to remove the conductive oxide layer in the field without the photoresist. This etching process could be wet or dry. An example of a wet etch chemistry would include HCl or HCl and FeCl$_3$. In this embodiment the conductive oxide stripe region forms all of the lateral index contrast to provide the lateral waveguide.

In a preferred embodiment an electron cyclotron resonance (ECR) deposition method is used to form an indium tin oxide (ITO) layer as the electrically conductive oxide. By using the ECR process to deposit ITO a low damage will be inflicted on the semiconductor surface to enable very good contact resistance. The bulk resistivity of these ITO films can be less than about 10E-4 ohm·cm, less than about 4E-4 ohm·cm, or less than about 3E-4 ohm·cm. This resistivity is drastically higher than typical p-type GaN or p-type AlGaN which can be 3 to 4 orders of magnitude higher. The lower resistivity will result in a lower device series resistance and hence a lower operating voltage within the laser diode for higher efficiency. Further, the index of refraction of the ITO will be lower than that of GaN, AlGaN, or InAlGaN to provide better waveguiding for laser diodes operating in the blue and green wavelength regimes. For example, in the 450 nm range the index of refraction for ITO is about 2.05 and for GaN it is about 2.48 while in the 525 nm range the index of refraction for ITO is about 1.95 and for GaN it is about 2.41. The lower refractive index of the ITO will provide higher index contrast with the InGaN based active region and hence can provide higher overlap with the quantum wells for higher modal gain. In a specific example, the conductive oxide is formed at a temperature less than 350° C. or at a temperature less than 200° C. Additionally, for both the conductive oxide and the low temp pGaN, the laser device is operable in the 500 nm to 600 nm range.

In an alternative embodiment an electron cyclotron resonance (ECR) deposition method is used to form a zinc oxide (ZnO) layer as the electrically conductive oxide. By using the ECR process to deposit ZnO a low damage will be inflicted on the semiconductor surface to enable very good contact resistance. The ECR deposition occurs at a rate of 1 Å to 3 Å per second, provides an ohmic contact to the p-layer it is deposited on, and provides a suitable sheet resistance for and absorption coefficient for forming an electrically conductive and low optical loss cladding region.

In an alternative specific embodiment, the present invention also provides a method and structure using a low temperature pGaN or p-cladding region. In a specific embodiment, the p-GaN is grown at a temperature lower than 150° C. of a temperature used to grown the active region for the same optical device. Such optical device is configured on a specific semipolar plane, which is more prone to degradation and therefore growth of the p-cladding is desirable at even a cooler temperature than the growth temperature of the active region to prevent thermal damage. In an example, the present method provides a pGaN growth temperature of less than 75° C. above the active region growth temperature and less than 50° C. above the active region growth temperature.

In some embodiments, the structure may include an optical blocking layer to prevent radiation leakage into the substrate and improve the device characteristics. Although AlInN is a preferred embodiment for optical blocking layers, or OBL, there can be other variations, modifications, and alternatives. An example of such OBL configured with the present invention can be found in U.S. application Ser. No. 13/288,268 filed on Nov. 3, 2011, which is incorporated by reference herein. In a specific embodiment, the optical blocking region can include low Ga content InAlGaN as the optical blocker. In other embodiments, the low Ga content $Al_{1-x-y}In_yGa_xN$ would possess an x of less than 10%, x of less than 20%, or x of less than 30%.

In a preferred embodiment, the contact regions can also be subjected to selected scribing of n-type material.

In a specific embodiment, the present invention provides an optical device, e.g., laser, LED. The device includes a gallium and nitrogen containing material having a semipolar surface configured on one of either a (30-3-1), (30-31), (20-2-1), or (30-3-2) orientation. In an example, the semipolar surface has an offcut of the orientation. The device also has an n-type region overlying the semipolar surface. The device has a superlattice region overlying the semipolar surface, the superlattice being characterized by 20 to 150 periods of alternating GaN and InGaN layers, alternating AlGaN and InAlGaN layers, alternating AlGaN and GaN layers, or alternating GaN and InAlAGaN layers, each of the alternating layers in the superlattice having a thickness ranging from 0.5 nm to 20 nm. The device has an active region comprising at least one active layer region overlying the superlattice region. The active region comprises a quantum well region or a double hetero-structure region. The device has a p-type region overlying the active region. The active region configured to emit electromagnetic radiation with a wavelength between 400 nm and 500 nm or between 500 nm and 660 nm. In an example, the offcut of the orientation is between +/−5 degrees toward a c-plane and between +/−10 degrees toward an a-plane.

In an alternative embodiment, the present invention provides a laser device. The device includes a gallium and nitrogen containing material having a semipolar surface configured on one of either a (30-3-1), (30-31), (20-2-1), or (30-3-2) orientation. The semipolar surface has an offcut of the orientation. The device has an n-type cladding region overlying the semipolar surface, and an active region comprising at least one active layer region overlying the n-type cladding region. The active region comprises a quantum well region or a double hetero-structure region. The device also has a p-type cladding region overlying the active region. The device has a laser stripe region formed overlying a portion of the semipolar surface. The laser stripe region is characterized by a cavity orientation substantially parallel to the projection of a c-direction. The laser stripe region has a first end and a second end. A first facet is provided on the first end of the laser stripe region and a second facet provided on the second end of the laser stripe region. The laser diode is configured to emit an electromagnetic radiation with a peak wavelength of between 400 nm and 500 nm or between 500 nm and 560 nm. In an example, the offcut of the orientation is between +/−5 degrees toward a c-plane and between +/−10 degrees toward an a-plane. In an example, the active region contains a plurality of quantum well regions comprising 1 to 7 quantum wells. Each of the quantum wells comprises substantially InGaN. The plurality of quantum well regions ranges in thickness from 2 nm to 5 nm or 5 nm to 10 nm. Alternatively, the active region contains a double heterostructure region, which ranges in thickness from 10 nm to about 25 nm.

In an alternative embodiment, the present invention provides a laser device. The device has a gallium and nitrogen containing material having a semipolar surface configured on one of either a (30-3-1), (30-31), (20-2-1), (20-21) or (30-3-2) orientation. The device has an n-type cladding region overlying the semipolar surface and an active region comprising at least one active layer region overlying the n-type cladding region. The device has a low temperature conductive oxide overlying the active region. The low temperature conductive oxide is formed overlying the active region at a lower process temperature than a process temperature used to form the active region. The device also has a laser stripe region formed overlying a portion of the semipolar surface. The laser diode is configured to emit an electromagnetic radiation with a peak wavelength of between 400 nm and 500 nm or between 500 nm and 560 nm. In an example, the conductive oxide is selected from indium tin oxide (ITO) or zinc oxide (ZnO).

In an alternative embodiment, the present invention provides a method for fabricating a laser device. The method includes providing a gallium and nitrogen containing material having a semipolar surface configured on one of either a (30-3-1), (30-31), (20-2-1), (20-21) or (30-3-2) orientation. The method includes forming an n-type cladding region overlying the semipolar surface and forming an active region comprising at least one active layer region overlying the n-type cladding region. The method includes depositing a low temperature conductive oxide overlying the active region. The low temperature conductive oxide is formed overlying the active region at a lower process temperature than a process temperature used to form the active region. The method also includes forming a laser stripe region formed overlying a portion of the semipolar surface. The conductive oxide is selected from indium tin oxide (ITO) or zinc oxide (ZnO), which is transparent and can be formed at a lower temperature. Further details of the present method can be found throughout the present specification and more particularly below.

In an embodiment for lasers or LEDs fabricated on a family of planes including, but not limited to, (30-3-2), (20-2-1), (30-3-1), (30-32), (20-21), (30-31) or any orientation within +/−10 degrees toward c-plane and/or a-plane from these orientations, the epitaxial device structure would contain a thin, 5 nm to 20 nm or 20 nm to 100 nm, p-cladding region grown above the light emitting or quantum regions. This thin p-cladding layer could be comprised of GaN, AlGaN, InGaN, or InAlGaN and doped with a species such as magnesium. Ultra-thin layers in this range grown at temperatures equal to or only slightly hotter (10° C. to 75° C.) than the growth temperature used for the light emitting layers would mitigate degradation to the light emitting layers that typically occurs when the layers are grown hotter or thicker. The reduced thermal degradation is a result of the relatively short growth time and the low growth temperature required for deposition of the thin p-clad layer. The benefit would perhaps be greater for a laser diode since much thicker p-type cladding layers are required to an LED, and therefore one would expect a larger degree of thermal degradation to the active region during the growth of the p-clad in a laser structure.

After the epitaxial growth is complete by MOCVD or other method, one or more conducting oxide layers such as indium-tin-oxide (ITO) or zinc oxide (ZnO) would then be deposited directly on or generally above the thin p-cladding layer. These conducting oxide layers can be deposited at a lower temperature lower than a typical p-cladding growth temperature and even substantially lower than the growth temperature of the light emission region. This will prevent or substantially reduce any thermal degradation to the light emission region that would have occurred during the epitaxial growth of the conventional p-cladding region. The resulting conducting oxide layer can act as a p-cladding region in both laser and LED structures and can enable the formation of a good p-contact on top of the conducting oxide layer that results in ohmic or quasi-ohmic characteristics. Additionally, the conducting oxide layers can have optical absorption coefficients at the wavelength ranges of interest which are lower or significantly lower than the optical absorption coefficient of a typical highly doped epitaxial p-type cladding regions such as GaN or AlGaN, and may therefore help to reduce optical absorption for lower internal losses in a laser cavity or higher extraction efficiency in an LED device. In an alternative embodiment, metallic layers such as silver may be used in place of conducting oxide layers.

In a specific embodiment, the present invention provides a laser device. The device has a gallium and nitrogen containing material having a semipolar surface configured on one of either a (30-3-1), (30-31), (20-2-1), (20-21) or (30-3-2) orientation. The device has an n-type cladding region overlying the semipolar surface and an active region comprising at least one active layer region overlying the n-type cladding region. The device has a p-type cladding region overlying the active region, the p-type cladding region being formed from a low temperature GaN, AlInGaN, or AlGaN material. The p-type cladding region is formed at a vicinity of or lower process temperature than a process temperature of forming the active region. The device has a laser stripe region formed overlying a portion of the semipolar surface. The laser stripe region is characterized by a cavity orientation substantially parallel to the projection of a c-direction. The laser stripe region has a first end and a second end, and respective first facet and second facet. The laser diode is configured to emit an electromagnetic radiation with a peak wavelength of between 400 nm and 500 nm or between 500 nm and 560 nm. In an example, the p-type cladding region is formed from the low temperature material at a temperature less than 75 degrees Celsius greater than the temperature used to form the active region. The p-type cladding region is formed from the low temperature material at a temperature less than 50 degrees Celsius greater than the temperature used to form the active region. In example, the p-type cladding region is formed at a temperature equal to or less than the temperature used to form the active region, and the p-type cladding region is formed with an average growth rate of less than 1.5 angstroms per second. Further details of the present device and related method can be found throughout the present specification and more particularly below.

In another embodiment for lasers or LEDs fabricated on a family of planes including, but not limited to, (30-3-2), (20-2-1), (30-3-1), (30-32), (20-21), (30-31) or any orientation within +/−10 degrees toward c-plane and/or a-plane from these orientations, the epitaxial device structure would contain a p-type cladding region grown at very low growth temperature while still enabling an acceptable voltage characteristic within the device. The p-cladding layer could be comprised of GaN, AlGaN, InGaN, or InAlGaN and could be doped with a species such as magnesium. The very low growth temperature would range those temperatures less than, equal to, or only slightly hotter (10° C. to 75° C.) than the growth temperature used for the light emitting layers. More typically, the p-cladding region is grown at temperatures more than 50° C., more than 100° C., or more than 150° C. hotter than the light emitting layers. The substantially lower growth temperature would mitigate degradation to the light emitting layers that typically occurs when the layers are grown hotter or thicker. In a laser diode structure, the growth conditions, layer thickness, and layer composition would be designed to enable a laser device operable below 7V, operable below 6V, or operable below 5V. In an LED structure, the growth conditions, layer thickness, and layer composition would be designed to enable an LED device operable below 6V, operable below 5V, or operable below 4V, or operable below 3.5V.

In an alternative specific embodiment, the present invention provides a laser device configured on an offcut. The device includes a gallium and nitrogen containing material having a semipolar surface configured on one of either a (30-3-1) orientation, (30-31) orientation, (20-2-1) orientation, (20-21) orientation, or (30-3-2) orientation. The semipolar surface has an offcut of the orientation characterized by an offcut toward an a-plane. The offcut is toward the a-plane is greater in magnitude than 1 degree and less than about 10 degrees. The offcut can also be toward the a-plane is characterized by the absolute magnitude of angle between 3 and 6 degrees or the offcut of the orientation is characterized by an offcut toward a c-plane; the offcut toward the c-plane is between +/−5 degrees. The device also has an n-type cladding region overlying the semipolar surface and an active region comprising at least one active layer region overlying the n-type cladding region.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above toward an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above toward an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 and even non-standard packaging. The present device can be implemented in a co-packaging configuration such as those described in U.S. Publication No. 2010/0302464, which is incorporated by reference herein.

In other embodiments, the present laser device can be configured in a variety of applications. Such applications include laser displays, metrology, communications, health care and surgery, information technology, and others. As an example, the present laser device can be provided in a laser display such as those described in U.S. Publication No. 2010/0302464, which is incorporated by reference herein.

Figure 20:
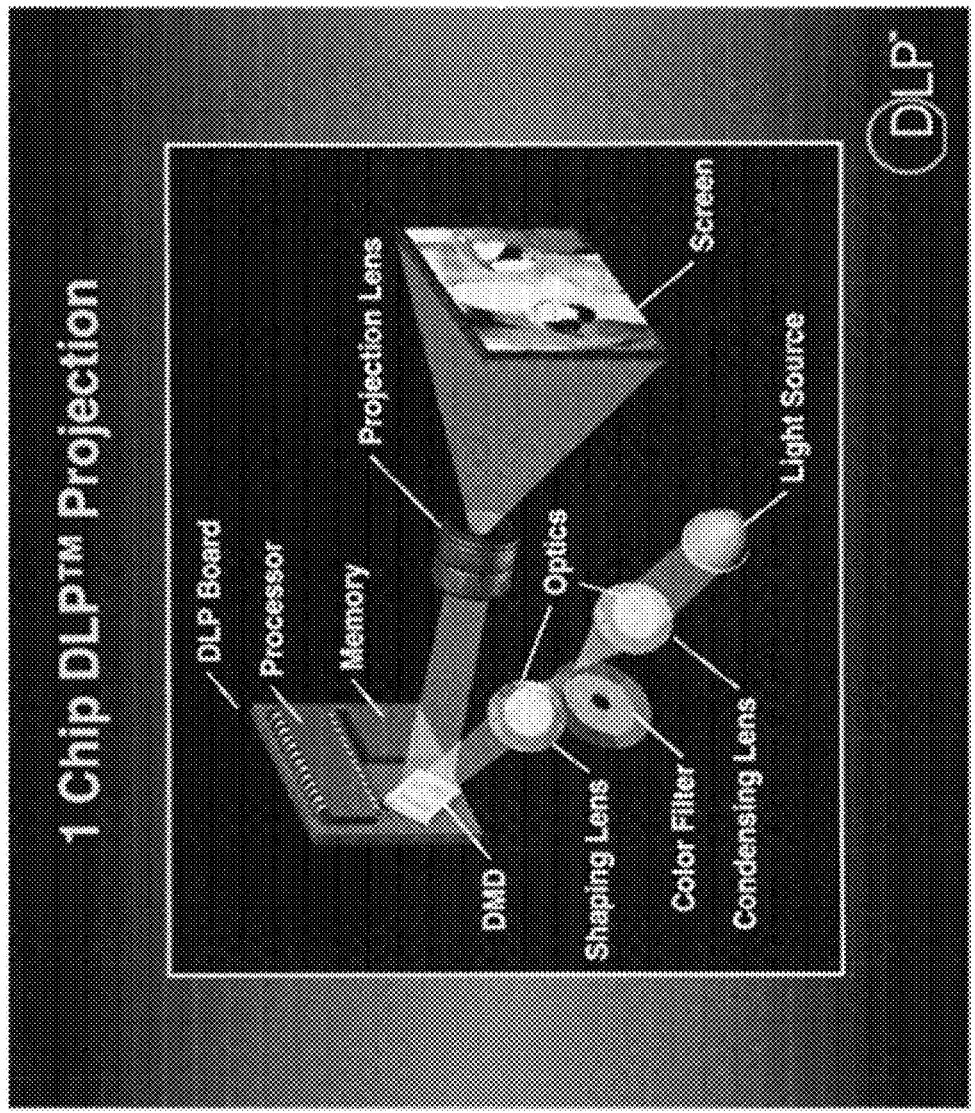
FIG. 20 is a simplified diagram of a DLP projection device according to an embodiment of the present invention.

FIG. 20 is a simplified diagram of a DLP projection device according to an embodiment of the present invention. This diagram is merely an example, which should not unduly limit the scope of the claims. One of ordinary skill in the art would recognize many variations, alternatives, and modifications. As shown in FIG. 20, a projection apparatus includes, among other things, a light source, a condensing lens, a color wheel, a shaping lens, and a digital lighting processor (DLP) board, and a projection lens. The DLP board, among other things, includes a processor, a memory, and a digital micromirror device (DMD).

Figure 21:
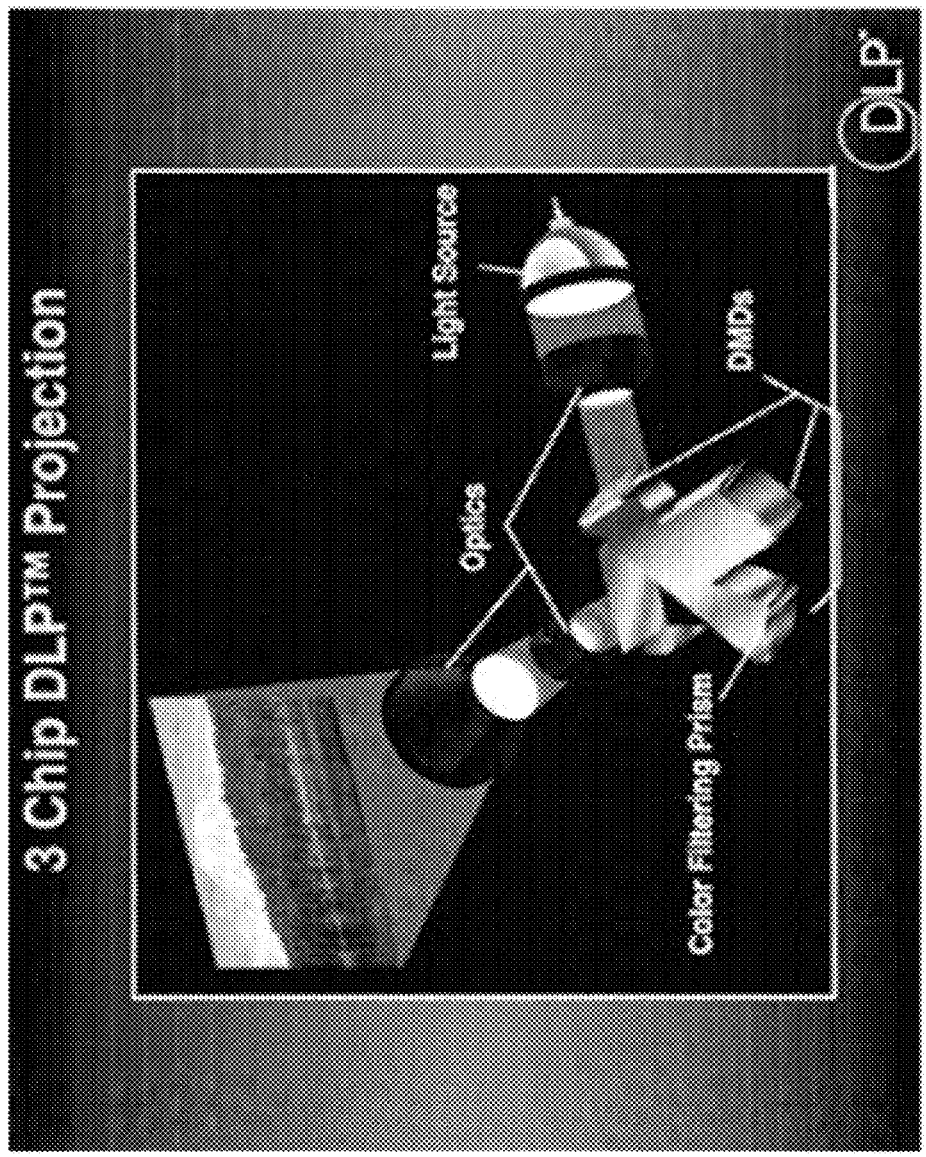
FIG. 21 is a simplified diagram illustrating a 3-chip DLP projection system according to an embodiment of the present invention.

FIG. 21 is a simplified diagram illustrating a 3-chip DLP projection system according to an embodiment of the present invention. This diagram is merely an example, which should not unduly limit the scope of the claims. One of ordinary skill in the art would recognize many variations, alternatives, and modifications. As shown in FIG. 20, the 3-chip DLP projection system includes a light source, optics, and multiple DMDs, and a color wheel system. As shown, each of the DMDs is associated with a specific color.

According to another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The apparatus includes a digital light processing chip (DLP) comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could be housed in the same packaged. In this copackaging embodiment, the outputs from the blue, green, and red laser diodes would be combined into a single beam.

As an example, the color wheel may include phosphor material that modifies the color of light emitted from the light source. In a specific embodiment, the color wheel includes multiple regions, each of the regions corresponding to a specific color (e.g., red, green, blue, etc.). In an exemplary embodiment, a projector includes a light source that includes blue and red light sources. The color wheel includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and color wheels thereof.

As another example, the color wheel may include multiple phosphor materials. For example, the color wheel may include both green and red phosphors in combination with a blue light source. In a specific embodiment, the color wheel includes multiple regions, each of the regions corresponding to a specific color (e.g., red, green, blue, etc.). In an exemplary embodiment, a projector includes a light source that includes a blue light source. The color wheel includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the color wheel, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and color wheels thereof.

As another example, the color wheel may include blue, green, and red phosphor materials. For example, the color wheel may include blue, green and red phosphors in combination with a ultra-violet (UV) light source. In a specific embodiment, color wheel includes multiple regions, each of the regions corresponding to a specific color (e.g., red, green, blue, etc.). In an exemplary embodiment, a projector includes a light source that includes a UV light source. The color wheel includes three phosphor containing regions for converting UV light to blue light, UV light to green light, and UV light and to red light, respectively. In operation, the color wheel emits blue, green, and red light from the phosphor containing regions in sequence. The blue, green and red light from the phosphor may be transmitted through the color wheel, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and color wheels thereof.

According to yet another embodiment, the present invention provides a projection apparatus. The apparatus includes a housing having an aperture. The apparatus includes an input interface for receiving one or more frames of images. The apparatus includes a laser source. The laser source includes a blue laser diode, a green laser diode, and a red laser diode. The blue laser diode is fabricated on a nonpolar or semipolar oriented Ga-containing substrate and has a peak operation wavelength of about 430 to 480 nm. The green laser diode is fabricated on a nonpolar or semipolar oriented Ga-containing substrate and has a peak operation wavelength of about 490 nm to 540 nm. The red laser could be fabricated from AlInGaP. The green laser diode has a wavelength of about 490 nm to 540 nm. The laser source is configured produce a laser beam by coming outputs from the blue, green, and red laser diodes. The apparatus includes a digital light processing chip comprising three digital mirror devices. Each of the digital mirror devices includes a plurality of mirrors. Each of the mirrors corresponds to one or more pixels of the one or more frames of images. The color beams are respectively projected onto the digital mirror devices. The apparatus includes a power source electrically coupled to the laser sources and the digital light processing chip. Many variations of this embodiment could exist, such as an embodiment where the green and blue laser diode share the same substrate or two or more of the different color lasers could housed in the same packaged. In this copackaging embodiment, the outputs from the blue, green, and red laser diodes would be combined into a single beam.

As an example, the color wheel may include phosphor material that modifies the color of light emitted from the light source. In a specific embodiment, the color wheel includes multiple regions, each of the regions corresponding to a specific color (e.g., red, green, blue, etc.). In an exemplary embodiment, a projector includes a light source that includes blue and red light sources. The color wheel includes a slot for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and color wheels thereof.

As another example, the color wheel may include multiple phosphor materials. For example, the color wheel may include both green and red phosphors in combination with a blue light source. In a specific embodiment, the color wheel includes multiple regions, each of the regions corresponding to a specific color (e.g., red, green, blue, etc.). In an exemplary embodiment, a projector includes a light source that includes a blue light source. The color wheel includes a slot for the blue laser light and two phosphor containing regions for converting blue light to green light, and blue light and to red light, respectively. In operation, the blue light source (e.g., blue laser diode or blue LED) provides blue light through the slot and excites green light and red light from the phosphor containing regions. The green and red light from the phosphor may be transmitted through the color wheel, or reflected back from it. In either case the green and red light is collected by optics and redirected to the microdisplay. The blue light source may be a laser diode or LED fabricated on non-polar or semi-polar oriented GaN. It is to be appreciated that can be other combinations of colored light sources and color wheels thereof.

As another example, the color wheel may include blue, green, and red phosphor materials. For example, the color wheel may include blue, green and red phosphors in combination with a ultra-violet (UV) light source. In a specific embodiment, color wheel includes multiple regions, each of the regions corresponding to a specific color (e.g., red, green, blue, etc.). In an exemplary embodiment, a projector includes a light source that includes a UV light source. The color wheel includes three phosphor containing regions for converting UV light to blue light, UV light to green light, and UV light and to red light, respectively. In operation, the color wheel emits blue, green, and red light from the phosphor containing regions in sequence. The blue, green and red light from the phosphor may be transmitted through the color wheel, or reflected back from it. In either case the blue, green, and red light is collected by optics and redirected to the microdisplay. The UV light source may be a laser diode or LED fabricated on non-polar or semi-polar oriented GaN. It is to be appreciated that can be other combinations of colored light sources and color wheels thereof.

In one or more other embodiments, the present invention may include aspects of those described in U.S. Publication No. 2011/0064101; U.S. application Ser. No. 13/288,268 filed on Nov. 3, 2011; and U.S. application Ser. No. 13/357,518, each of which is incorporated by reference herein.

While the above is a full description of the specific embodiments, various modifications, alternative constructions and equivalents may be used. As used herein, the term "substrate" can mean the bulk substrate or can include overlying growth structures such as a gallium and nitrogen containing epitaxial region, or functional regions such as n-type GaN, combinations, and the like. Therefore, the above description and illustrations should not be taken as limiting the scope of the present invention which is defined by the appended claims.

What is claimed is:

1. A method of operating a system comprising:
   in a lighting apparatus coupled to a laser device configured to provide light for the lighting apparatus, the laser device comprising:
   a gallium and nitrogen containing material comprising a semipolar surface having an offcut orientation of between +/−5 degrees toward a c-plane and between +/−10 degrees toward an a-plane;
   an n-type cladding region overlying the semipolar surface;
   an active region comprising at least one light emitting active layer region overlying the n-type cladding region; the light emitting active layer region including:
   a plurality of quantum well regions comprising 1 to 7 quantum wells, each of the quantum wells comprising InGaN and ranging in thickness from 2 nm to 5 nm or from 5 nm to 10 nm; or
   a double hetero-structure region ranging in thickness from 10 nm to 25 nm;
   a p-type cladding region overlying the active region;
   a conductive oxide overlying the p-type cladding region;

a laser stripe region comprising at least a portion of the p-type cladding region and the conductive oxide, the laser stripe region being characterized by a cavity orientation substantially parallel to the projection of a c-direction, the laser stripe region having a first end and a second end;

a first facet having a first mirror surface provided on the first end of the laser stripe region;

a reflective coating provided on the first facet; and a second facet having a second mirror surface provided on the second end of the laser stripe region, wherein the laser device is configured to emit electromagnetic radiation with a peak wavelength of between 400 nm and 500 nm or between 500 nm and 560 nm;

emitting electromagnetic radiation with the peak wavelength of between 400 nm to 500 nm or between 500 nm and 560 nm.

2. The method of claim 1, wherein the first facet and the second facet are etched facets formed using a lithography and etching process.

3. The method of claim 1, wherein the conductive oxide comprises indium tin oxide (ITO).

4. The method of claim 1, wherein the conductive oxide comprises zinc oxide (ZnO).

5. The method of claim 1, wherein the conductive oxide comprises indium tin oxide (ITO) and is formed from an electron cyclotron resonance deposition technique.

6. The method of claim 1, wherein the conductive oxide is formed from an electron cyclotron resonance deposition technique at a process temperature below 200° C.

7. The method of claim 1, wherein the conductive oxide is formed from an electron cyclotron resonance deposition technique at a process temperature below 200° C., wherein the substrate contains a photoresist layer during deposition to provide a lift-off technique.

8. The method of claim 1, wherein the conductive oxide is ZnO and is formed from an electron cyclotron resonance to deposition technique.

9. The method of claim 1 wherein the semipolar surface is configured on a (30-3-1) orientation, a (30-31) orientation, a (20-2-1) orientation, a (20-21) orientation, or a (30-3-2) orientation.

10. A method for fabricating a lighting apparatus, the method comprising:

processing a laser device by:

providing a gallium and nitrogen containing material having a semipolar surface configured on one of either a (30-3-1) orientation, a (30-31) orientation, a (20-2-1) orientation, a (20-21) orientation, or a (30-3-2) orientation, the semipolar surface having an offcut of the orientation;

forming an n-type cladding region overlying the semipolar surface;

forming an active region comprising at least one light emitting active layer region overlying the n-type cladding region; the light emitting active layer region comprising a quantum well region or a double hetero-structure region; and depositing a conductive oxide overlying the active region, the conductive oxide being formed from an electron cyclotron resonance deposition technique at a process temperature below 200° C. to maintain a substantially crystalline characteristic of the active region to emit electromagnetic radiation within a desired electroluminescence efficiency, wherein the substrate contains a photoresist layer during deposition to provide a lift-off technique, the conductive oxide forming at least a part of a laser stripe region, the laser stripe region being characterized by a cavity orientation substantially parallel to the projection of a c-direction, the laser stripe region having a first end and a second end;

forming a first facet having a first mirror surface on the first end of the laser stripe region;

forming a reflective coating on the first facet; and forming a second facet having a second mirror surface on the second end of the laser stripe region, wherein the laser device is configured to emit electromagnetic radiation with a peak wavelength of between 400 nm and 500 nm or 500 nm and 580 nm; and packaging the laser device in the lighting apparatus.

11. The method of claim 10, wherein the conductive oxide is selected from indium tin oxide (ITO) and zinc oxide (ZnO).

12. The method of claim 10, wherein the conductive oxide is ZnO.

13. The method of claim 10, wherein the first facet and the second facet are etched facets formed using a lithography and etching process.

* * * * *